(12) United States Patent
Shelnutt

(10) Patent No.: US 12,720,714 B2
(45) Date of Patent: Aug. 25, 2026

(54) SMART RACK LIQUID COOLING MANIFOLD SYSTEM HAVING INTEGRATED CONTROLLER(S) PROVIDING SERVER-LEVEL LIQUID TELEMETRY MONITORING, RACK LIQUID FLOW CONTROL, AND DATACENTER COMMUNICATON

(71) Applicant: STRATEGIC THERMAL LABS, LLC

(72) Inventor: Austin Shelnutt, Georgetown, TX (US)

(73) Assignee: Strategic Thermal Labs, LLC, Georgetown, TX (US)

( * ) Notice: Subject to any disclaimer, the term of this patent is extended or adjusted under 35 U.S.C. 154(b) by 507 days.

(21) Appl. No.: 18/493,690

(22) Filed: Oct. 24, 2023

(65) Prior Publication Data

US 2024/0138118 A1 Apr. 25, 2024
US 2024/0237297 A9 Jul. 11, 2024

Related U.S. Application Data

(60) Provisional application No. 63/418,948, filed on Oct. 24, 2022, provisional application No. 63/418,938, (Continued)

(51) Int. Cl.
*H05K 7/20* (2006.01)

(52) U.S. Cl.
CPC ......... *H05K 7/207* (2013.01); *H05K 7/20254* (2013.01); *H05K 7/20636* (2013.01)

(58) Field of Classification Search
CPC . H05K 7/207; H05K 7/20254; H05K 7/20636
See application file for complete search history.

(56) References Cited

U.S. PATENT DOCUMENTS 7,434,412 B1 10/2008 Miyahira
10,194,562 B2 1/2019 Shelnutt et al.
(Continued)

FOREIGN PATENT DOCUMENTS

CN 113994772 1/2022
WO 2018017254 1/2018

OTHER PUBLICATIONS

International Search Report, Patent Cooperation Treaty, International Application No. PCT/US2023/077682, Apr. 17, 2024; 5 pages.

(Continued)

*Primary Examiner* — Eric S Ruppert
(74) *Attorney, Agent, or Firm* — Isidore PLLC

(57) ABSTRACT

A rack liquid cooling manifold (RLCM) system includes a supply manifold to receive a cooling liquid for cooling heat-generating electronic components via a cold plate and a return manifold to exhaust the cooling liquid from the cold plate. The RLCM system includes a manifold control unit (MCU) integrated into the supply manifold or the return manifold that is communicatively coupled to a supply control valve and a datacenter control system. The MCU includes a memory with rack temperature and liquid control (RTLC) code and a processor that processes the RTLC code to cause the MCU to: receive node-level liquid telemetry data originating from one or more liquid telemetry sensors integrated at a respective node; trigger actuation of the supply control valve to control a rate of cooling liquid flow into the supply manifold, partly based on the liquid telemetry data; and communicate rack level information with the datacenter control system.

34 Claims, 14 Drawing Sheets

Related U.S. Application Data filed on Oct. 24, 2022, provisional application No. 63/418,932, filed on Oct. 24, 2022.

(56) References Cited

U.S. PATENT DOCUMENTS

| | | | | |
|---|---|---|---|---|
| 2013/0091868 | A1 | 4/2013 | Campbell et al. | |
| 2015/0253029 | A1 | 9/2015 | Palmer et al. | |
| 2017/0181325 | A1* | 6/2017 | Shelnutt ............. | H05K 7/20272 |
| 2017/0181326 | A1* | 6/2017 | Shelnutt ............. | H05K 7/20781 |
| 2018/0299933 | A1 | 10/2018 | Cui et al. | |
| 2019/0141862 | A1 | 5/2019 | Shelnutt et al. | |
| 2020/0367388 | A1 | 11/2020 | Franz et al. | |
| 2021/0382533 | A1 | 12/2021 | Heydari | |

OTHER PUBLICATIONS

Written Opinion of the International Searching Authority, International Application No. PCT/US2023/077682, Apr. 17, 2024; 18 pages.

* cited by examiner

SMART RACK LIQUID COOLING MANIFOLD SYSTEM HAVING INTEGRATED CONTROLLER(S) PROVIDING SERVER-LEVEL LIQUID TELEMETRY MONITORING, RACK LIQUID FLOW CONTROL, AND DATACENTER COMMUNICATON

CROSS-REFERENCE TO RELATED APPLICATIONS

The present application claims the benefit under 35 U.S.C. § 119 of the following U.S. Provisional Patent Applications, each filed on Oct. 24, 2022: (i) Ser. No. 63/418,932 entitled "Environmentally Hardened Cold Plate for Use in Liquid Cooling with Suboptimal Water Quality"; (ii) Ser. No. 63/418,938 entitled "Smart Rack Liquid Manifold"; and (iii) Ser. No. 63/418,948 entitled "Stacked-Fin Cold Plate using a 3D Vapor Chamber", the disclosures of which are hereby incorporated by reference in their entirety.

BACKGROUND

1. Technical Field

The present application relates generally to liquid cooling apparatuses used for cooling electronic devices in a computer rack, and more particularly, to a liquid manifold facilitating heat removal from one or more electronic devices in a computer rack.

2. Description of the Related Art

Recent trends in global digital transformation have created incredible demand for increased processing performance in colocation and edge deployments of data/information processing servers. Datacenters today rely upon high power microprocessor devices, such as central processors (CPUs) and graphic processing units (GPUs), which generate a high level of heat in a small area. These devices are integrated into information processing systems that are inserted into nodes of a rack. Each rack typically has a large number of vertically-arranged nodes to accommodate insertion of an equivalent number of information processing systems. Traditional use of air as the heat transfer medium to cool heat dissipating components within the IPSes is unable to meet the thermal dissipation requirement of these high power microprocessor devices. Thus, liquid cooling systems using localized cold plates have become a preferred way to provide the required cooling. Cold plates are a type of heatsink that allows for a liquid coolant to be brought into thermal conduction contact with the heat-generating electronic components of servers and other information processing systems.

Conventional liquid cooling system for rack information processing systems rely on a cooling distribution unit that recirculates a purified technology liquid coolant in a separate cooling loop that includes a standard manifold to avoid clogging and contamination with conventional cold plates.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
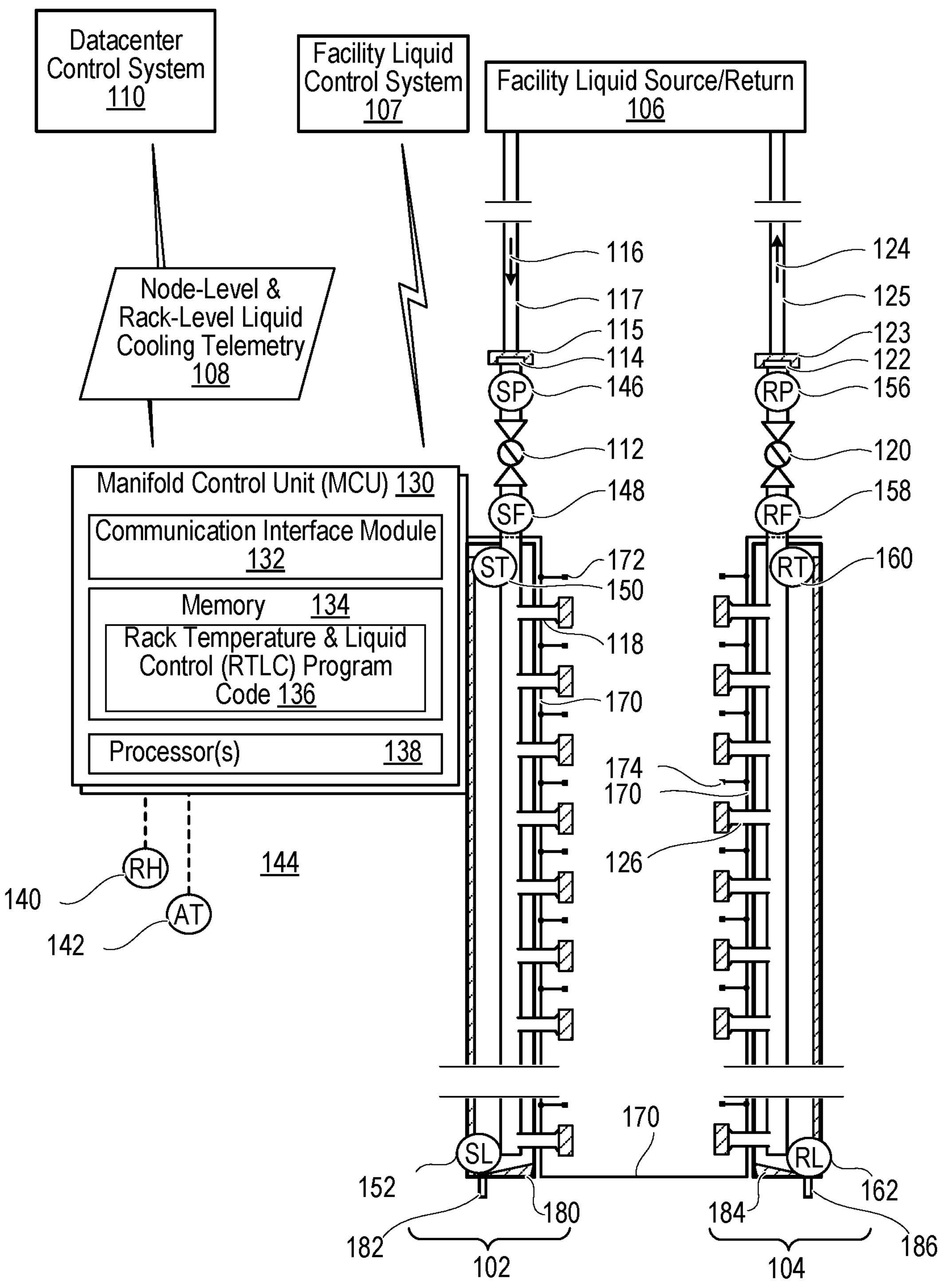
FIG. 1 is a diagram of a rack liquid cooling manifold (RLCM) system that controls an amount of liquid flow received into the RLCM system and into each information processing system (IPS) node, in part based on node level telemetry data, according to one or more embodiments.

The present disclosure provides a rack liquid cooling manifold (RLCM) system that controls an amount of liquid flow received into the RLCM system and into each information processing system (IPS) node of an IPS rack, in part based on received node level telemetry data. The RLCM system includes a supply manifold having a supply control valve and a manifold intake port available for sealably coupling to a facility liquid supply to receive a cooling liquid. The RLCM system includes more than one server supply ports each available for sealably coupling, for liquid transfer of the cooling liquid, to a respective cooling liquid supply input of a corresponding IPS node. Each IPS node is incorporated in a rack frame capable of supporting multiple IPS nodes. Each IPS node has one or more heat-generating electronic components and an attached cold plate assembly. A return manifold includes a facility liquid return port for sealably coupling to a facility return to exhaust the cooling liquid. The return manifold includes more than one server return ports. Each server return port is available for sealably coupling, for exhaust liquid transfer, to a respective cooling liquid exhaust output of the corresponding IPS node. The respective cooling liquid exhaust output and a paired supply liquid cooling input direct cooling liquid flow through one or more cold plate assembly positioned within the corresponding IPS node to thermally cool the one or more heat-generating electronic components. At least one manifold control unit is integrated into one of the supply manifold and the return manifold. The at least one manifold control unit includes at least one communication interface module configured to communicatively couple the at least one manifold control unit to the supply control valve and a datacenter control system. The at least one manifold control unit includes a memory having stored thereon rack temperature and liquid control (RTLC) code. The at least one manifold control unit includes at least one processor communicatively coupled to the at least one communication interface module and the memory. The at least one processor processes instructions of the RTLC code to cause the at least one manifold control unit, while the supply and return manifolds are connected to information processing systems within the IPS nodes, to perform liquid cooling functionality. The liquid cooling functionality includes the at least one manifold control unit receiving node-level liquid telemetry data originating from one or more liquid telemetry sensors integrated at a respective information processing system node. The at least one manifold control unit triggers an amount of actuation of the facility supply control valve to control a rate of cooling liquid flow into the supply manifold and triggers an amount of actuation of a node supply control valve to control a rate of fooling liquid flow into the node's cold plate assembly, in part based on the node-level liquid telemetry data. The at least one manifold control unit communicates rack level information with the datacenter control system.

According to a second aspect of the present disclosure, an information processing system (IPS) rack includes a rack frame divided into a plurality of rungs. Each rung is capable of supporting an information processing system node having an information processing system with one or more heat-generating electronic components. At least one cold plate assembly is attached to the one or more heat-generating electronic components within the IPS at each corresponding IPS node to thermally cool the one or more heat-generating electronic components via a cooling liquid flow. The IPS rack includes the RLCM system. In one or more embodiments, a datacenter includes the IPS rack and also includes the data center control system communicatively coupled to the at least one manifold control unit and the facility liquid supply.

According to a third aspect of the present disclosure, a method is provided of controlling liquid cooling of IPS nodes in an IPS rack via a rack liquid cooling manifold system. In one or more embodiments, the method includes receiving, by at least one manifold control unit of the RLCM system, node-level liquid telemetry data originating from one or more liquid telemetry sensors integrated at respective IPS nodes of an IPS rack to which the RLCM system is attached, the at least one manifold control unit integrated with and attached to the RLCM system. The method includes controlling, by the at least one manifold control unit, an amount of liquid flow into the RLCM system and into each IPS node, in part based on node level telemetry data. The controlling of the amount of liquid flow includes triggering a degree of actuation between a closed and a fully opened position of a supply control valve of the RLCM system to control a rate of cooling liquid flow into a supply manifold of the RLCM system. The controlling of the amount of liquid flow further includes triggering a degree of actuation a node supply control valve of a corresponding node cold plate system to control a rate of cooling liquid flow into the node's cold plate system. Heated liquid flow from each IPS node returns via a return manifold of the RLCM system.

In one or more aspects of the present disclosure, the RLCM system replaces and augments liquid cooling telemetry that is no longer available when a conventional cooling distribution unit is otherwise rendered obsolete by incorporation of an environmentally-hardened cold plate. Filtered but unpurified facility liquid may be used for cooling rather than purified technology cooling liquid. One of the challenges with using cold plates to provide liquid cooling of electronic components within a data center or server rack is the need for use of a complex system of multiple loops of cooling liquid due to the sensitive nature of the cold plate, which is susceptible to corrosion and clogging if exposed to a flow of regular liquid. During liquid cooling, the applied liquid flows through the microchannels between the heated fins of the cold plate to absorb the heat being conducted from the attached heat generating component. In order to prevent these microchannels and the fins from fouling due to corrosion or from solid particulate within the cooling liquid, cold plate solution providers generally require the use of tightly controlled secondary coolant with optimized chemical properties to inhibit corrosion and prevent biological growth, and which has been filtered of fluid-borne particulate. The secondary coolant, which is referred to as a technology coolant supply (TCS) flows through a loop of conduits that is coupled to the less tightly controlled facility water supply (FWS) via a liquid-to-liquid heat exchanger, typically housed within a coolant distribution unit (CDU). The CDU effectively isolates the cold plates from hazardous water quality. In addition to cost and complexity of implementation, one additional penalty or drawback of this multi-loop system is the fluid temperature gradient between the FWS and the TCS. This temperature gradient, which is sometimes called the "approach temperature", demands, according to thermodynamic laws, that the TCS always be warmer than the FWS when cooling information processing systems. This temperature gradient creates energy inefficiencies by forcing the FWS temperatures to have to be lowered so that the TCS temperatures stay within the specification of the microprocessor cold plate. This can limit cooling capacity of the achievable power utilization effectiveness (PUE) of the cooling solution. The present disclosure overcomes these deficiencies in the existing liquid cooling solutions by providing/manufacturing (i) a cold plate and a corresponding cold plate assembly and (ii) a RLCM system that integrates at least one manifold control unit attached to the manifold, to provide a liquid cooling system that can utilize facility water and does not require a CDU and associated CDU loop. The present disclosure provides an overall liquid cooling system for datacenters and IPS racks that are more efficient, less cumbersome, and less expensive to implement and maintain by providing cold plates that are resistive to fouling from direct exposure to facility water and utilizing the RLCM system that enables the data center cooling solution to be provided with a single cooling loop utilizing the facility water supply.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized. As a specific example, reference is made herein to the term facility liquid, facility water, facility cooling liquid, facility-grade cooling liquid, and cooling liquid. It is appreciated that the terms facility liquid or facility cooling liquid are utilized to provide a specific example of a cooling liquid supplied by/at a datacenter facility in which the heat generating electronic components are operating and being cooled in a single liquid cooling loop that includes facility liquid, which is typically unpurified water. Facility-grade cooling liquid is a more general term that can apply to both cooling liquid that is being provided at a datacenter facility or any other cooling liquid that can contain contaminants and particulates, similar to the normal facility liquid found in datacenters. Thus, facility-grade cooling liquid can apply to any type of liquid, regardless of the source of the liquid, and can also apply to liquid cooling that is not provided at a "facility" or datacenter. The descriptions herein are meant to apply to any type of facility-grade cooling liquid. Additionally, it is appreciated that the cooling liquid utilized within the cooling loop that includes the described cold plate assembly can also be a higher-grade cooling liquid than facility-grade cooling liquid, without limitation.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention. The description of the illustrative embodiments can be read in conjunction with the accompanying figures. Embodiments incorporating teachings of the present disclosure are shown and described with respect to the figures presented herein.

FIG. 1 is a diagram of smart rack liquid cooling manifold (RLCM) system 100 that controls an amount of cooling liquid flow received into supply manifold 102 from facility liquid source/return 106 and enables return of the heated cooling liquid via return manifold 104 to facility liquid source/return 106 in part based on received node level and rack-level telemetry data 108. RLCM system 100 also communicates node level and rack-level telemetry data 108 to datacenter control system 110. Facility liquid source/return 106 may represent a closed loop liquid cooling system that processes the returned liquid for reuse as supply liquid. Alternatively, facility liquid source/return 106, which is controlled by facility liquid cooling control 107, may represent an open loop liquid cooling system with separate facility liquid source and facility liquid return. In one or more embodiments, the return liquid may be channeled into a separate holding container than the supply/source container. Supply manifold 102 includes supply control valve 112 and manifold intake port 114 available for sealably coupling at coupling 115 to facility liquid supply/return 106 to receive cooling liquid 116 via supply distribution system 117. Supply manifold 102 also includes more than one server supply ports 118. Return manifold 104 of RLCM system 100 may optionally include return control valve 120 and includes facility liquid return port 122 for sealably coupling at coupling 123 to a facility liquid source/return 106 to direct return of exhaust cooling liquid 124 via return distribution system 125. Return manifold 104 may include return more than one server return ports 126.

RLCM system 100 includes at least one manifold control unit 130 integrated into one of supply manifold 102 and return manifold 104. The at least one manifold control unit 130 includes at least one communication interface module 132 configured to communicatively couple at least one manifold control unit 130 to supply control valve 112, return control valve 120, and datacenter control system 110. In one or more embodiments, the coupling for communication between the various components and communication interface module 132 can be wired, as via an ethernet cable or other wired connection. In one or more embodiments, the coupling can be wireless or a combination or wired and wireless. The at least one manifold control unit 130 includes memory 134 having stored thereon rack temperature and liquid control (RTLC) program code 136. The at least one manifold control unit 130 includes at least one processor 138 communicatively coupled to at least one communication interface module 132 and memory 134. The at least one processor 138 processes instructions of RTLC program code 136 to cause the at least one manifold control unit 130, while supply and return manifold 102 and 104 are connected to at least one node of the IPS rack, to perform functionality described herein. The at least one manifold control unit 130 receives node-level liquid telemetry data originating from one or more liquid telemetry sensors integrated at a respective information processing system node. Alternatively, or in addition, the at least one manifold control unit 130 may monitor liquid cooling sensors external to the information processing system nodes for rack-level or datacenter-level cooling telemetry data. In an example, the at least one manifold control unit 130 may monitor relative humidity ("AH") sensor 140 and ambient air temperature ("AT") sensor 142 in datacenter 144. In another example, the at least one manifold control unit 130 may monitor supply pressure ("SP") sensor 146, supply flow ("SF") rate sensor 148, supply temperature ("ST") sensor 150, and supply leak ("SL") sensor 152 incorporated into supply conduits of supply manifold 102. In an additional example, the at least one manifold control unit 130 may monitor supply pressure ("RP") sensor 156, return flow ("RF") rate sensor 158, return temperature ("RT") sensor 160, and return leak ("RL") sensor 162 incorporated into return conduits of return manifold 104. The at least one manifold control unit 130 triggers an amount of actuation of supply control valve 112 to control a rate of cooling liquid flow into supply manifold 102, in part based on the node-level liquid telemetry data. The at least one manifold control unit 130 communicates received rack and node level information as node level and rack-level telemetry data 108 with datacenter control system 110. At least one RLCM communication bus 170 with supply side electrical connectors 172 and return-side electrical connectors 174 communicatively couples at least one manifold control unit 130 to server microprocessors (see FIG. 4) and the one or more liquid telemetry sensors (see FIG. 4) integrated at a respective information processing system node. In one or more embodiments, the at least one manifold control unit 130 includes more than one manifold control unit 130 that are communicatively coupled by at least one RLCM communication bus 170.

In one or more embodiments, supply manifold 102 includes supply leak containment enclosure 180 that directs leaks in supply manifold 102 away from IPS nodes 310 and toward supply leak sensor 152 and supply leak drain 182. Return manifold 104 includes return leak containment enclosure 184 that directs leaks in return manifold 104 away from IPS nodes 310 and toward return leak sensor 162 and return leak drain 186.

Figure 2:
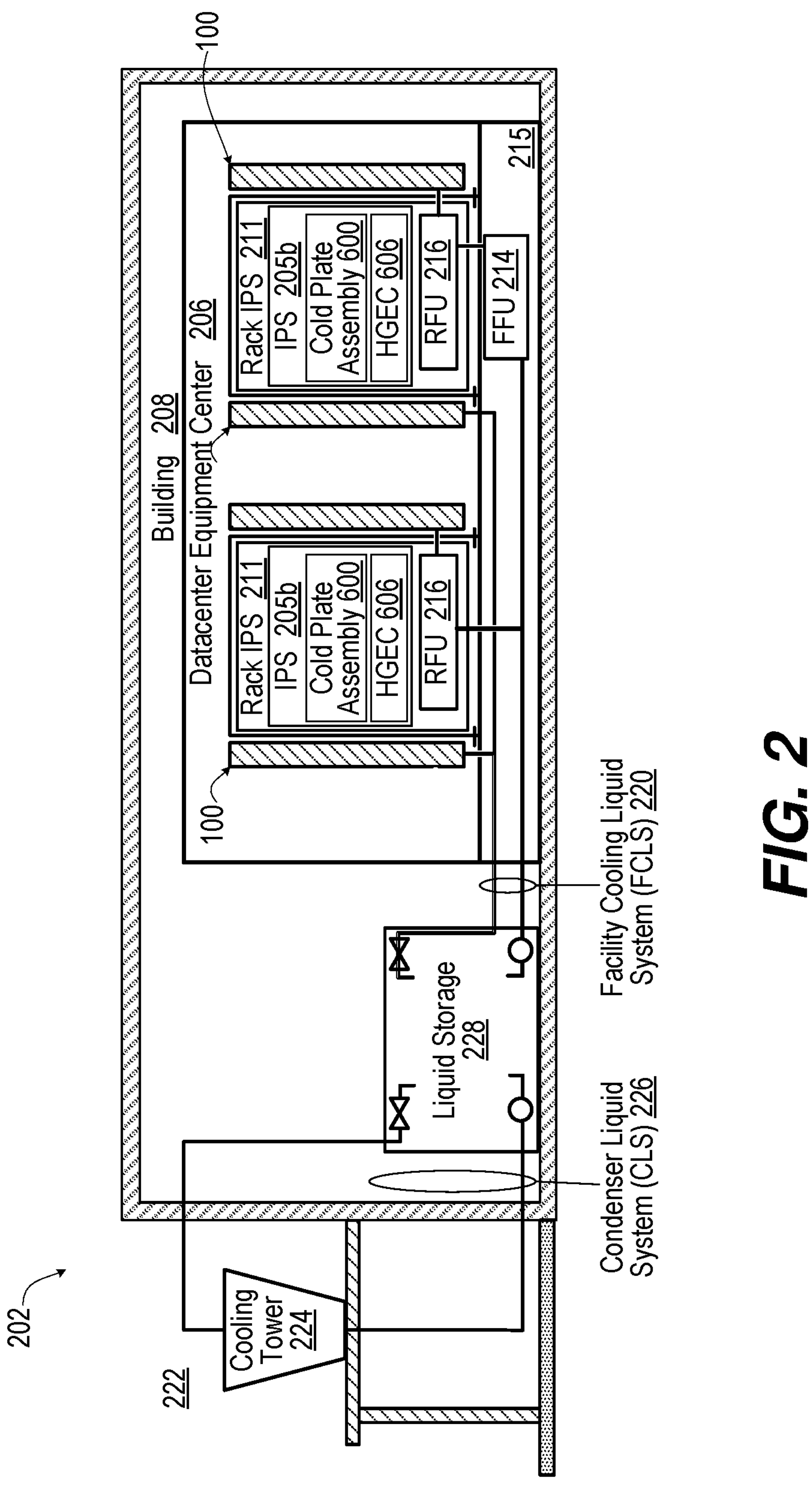
FIG. 2 is a diagram of an example liquid cooling system that supports a datacenter equipment center with rack-level liquid cooling of heat generating electronic components utilizing the RLCM system of FIG. 1, according to one or more embodiments.
Figure 4:
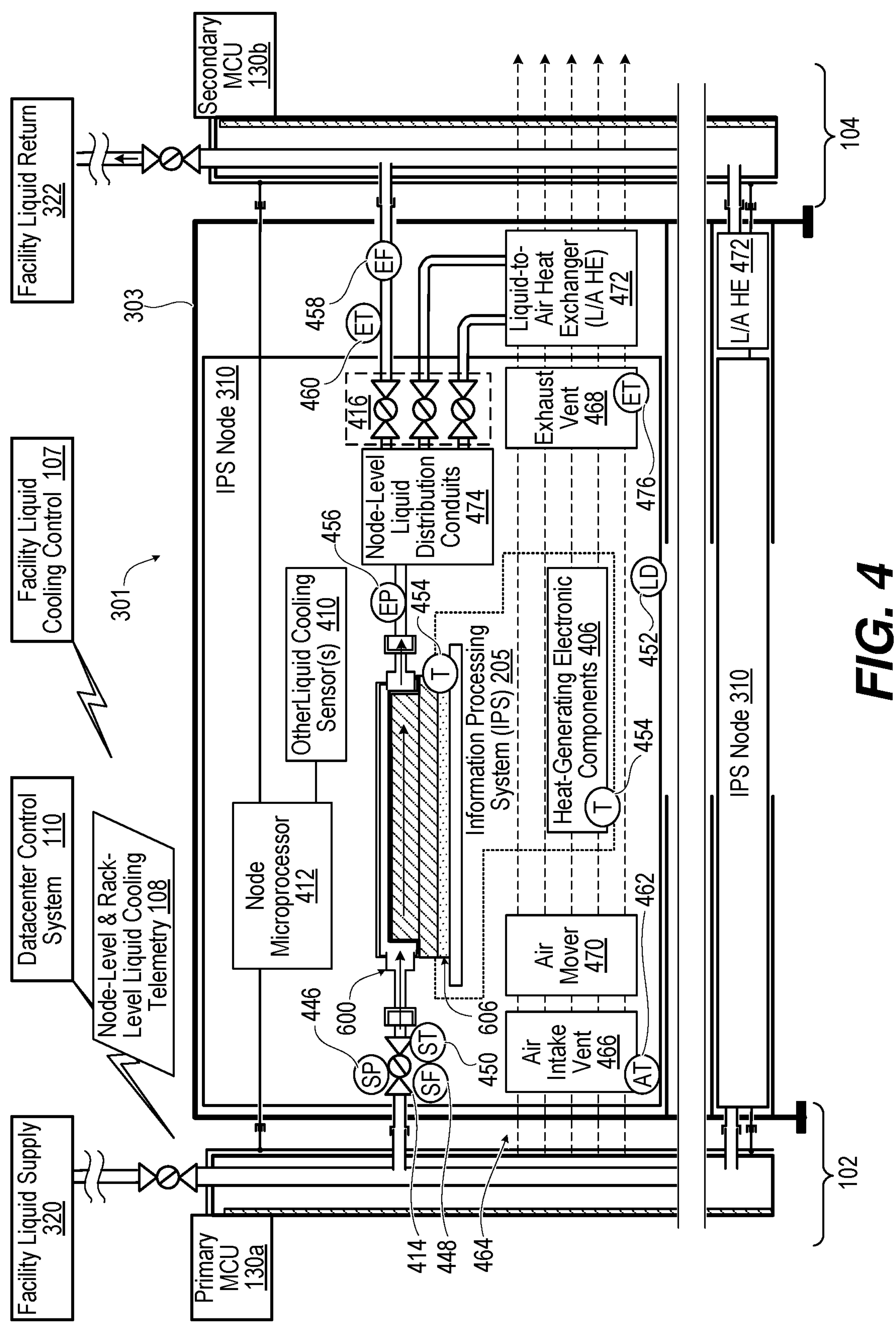
FIG. 4 is a diagram of an information processing system including the heat generating electronic component with an attached environmentally-hardened cold plate assembly as part of a liquid cooling system that includes node-level liquid cooling sensors and is augmented with air cooling capabilities, according to one or more embodiments.

FIG. 4 is a diagram of example use of RLCM system 100 within liquid cooling system 202 that supports datacenter equipment center 206 in building 208. In the provided example, datacenter equipment center 206 within building 208 includes two rack information processing systems (IPSes) 210 and 211 that have information processing systems (IPSes) 205*a* and 205*b* respectively, which receive liquid cooling by respective ones of cold plate assembly 600 (as presented in FIG. 6). In one or more embodiments, IPS rack 210 is supported by floor filtration unit (FFU) 214 in floor space 215 of datacenter equipment center 206. IPS rack 211 is supported by rack filtration unit (RFU) 216. Each IPS rack 210-211 has respective RLCM system 100 for managing liquid cooling at the rack level. In an example, FCLS 220 may transfer exhaust thermal energy directly into ambient air 222 via cooling tower 224. As depicted in FIG. 2, liquid cooling system 202 may further include condenser liquid system (CLS) 226 that circulates cooling water through cooling tower 224 from liquid storage 228. Inclusion of CLS 226 enables intermittent use of cooling tower 224. Alternatively, liquid cooling system 202 may further include a chiller that actively performs liquid-to-liquid heat exchange respectively between each of FCLS 220 and CLS 226.

Figure 3:
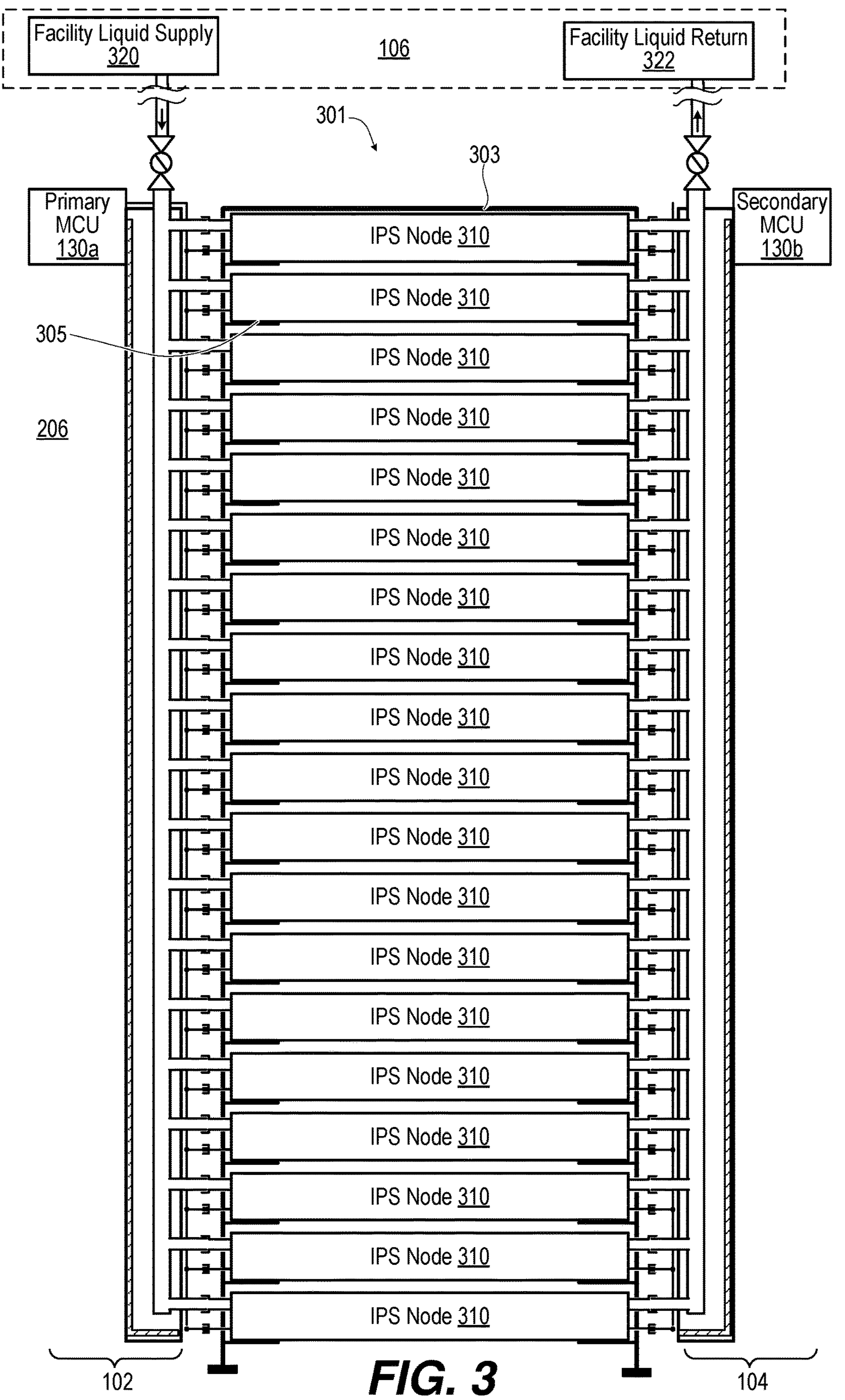
FIG. 3 is a diagram of an information processing system (IPS) rack that includes a rack frame with multiple IPS nodes, according to one or more embodiments.

FIG. 3 presents information processing system (IPS) rack 301 that includes rack frame 303 divided into a plurality of rungs 305. Each rung 305 is capable of supporting corresponding IPS node 310, which includes an operating IPS with heat generating components. IPS rack 301 includes RLCM system 100. In one or more embodiments, datacenter equipment center 206 ("Datacenter") includes IPS rack 301 and also includes data center control system 110 (FIG. 1) communicatively coupled to the at least one manifold control unit and facility liquid supply/return 106, which may be provided via separate facility liquid supply 320 and facility liquid return 322. In the illustrated embodiments of FIGS. 3 and 4, supply manifold 102 includes primary manifold control unit 130*a* and return manifold 104 includes secondary manifold control unit 103*b* that provides redundancy in operation of the at least one MCU 130. In one or more embodiments, control of RLCM system automatically switches to secondary MCU 130*b* from primary MCU 130*a* if primary MCU 130*a* becomes unresponsive, or enters into an error state, or is not responding to a periodic or triggered alive/awake ping from secondary MCU 130*b*. Generation of the alive/awake ping can be in response to a pre-established triggering such as the secondary MCU 130*b* receiving an out-of-range data from one of the various sensors with a condition that the primary MCU 130*a* is preconfigured to address and report to the secondary MCU 130*b*. Other triggers can be provided/established, in alternate embodiments.

Figure 6:
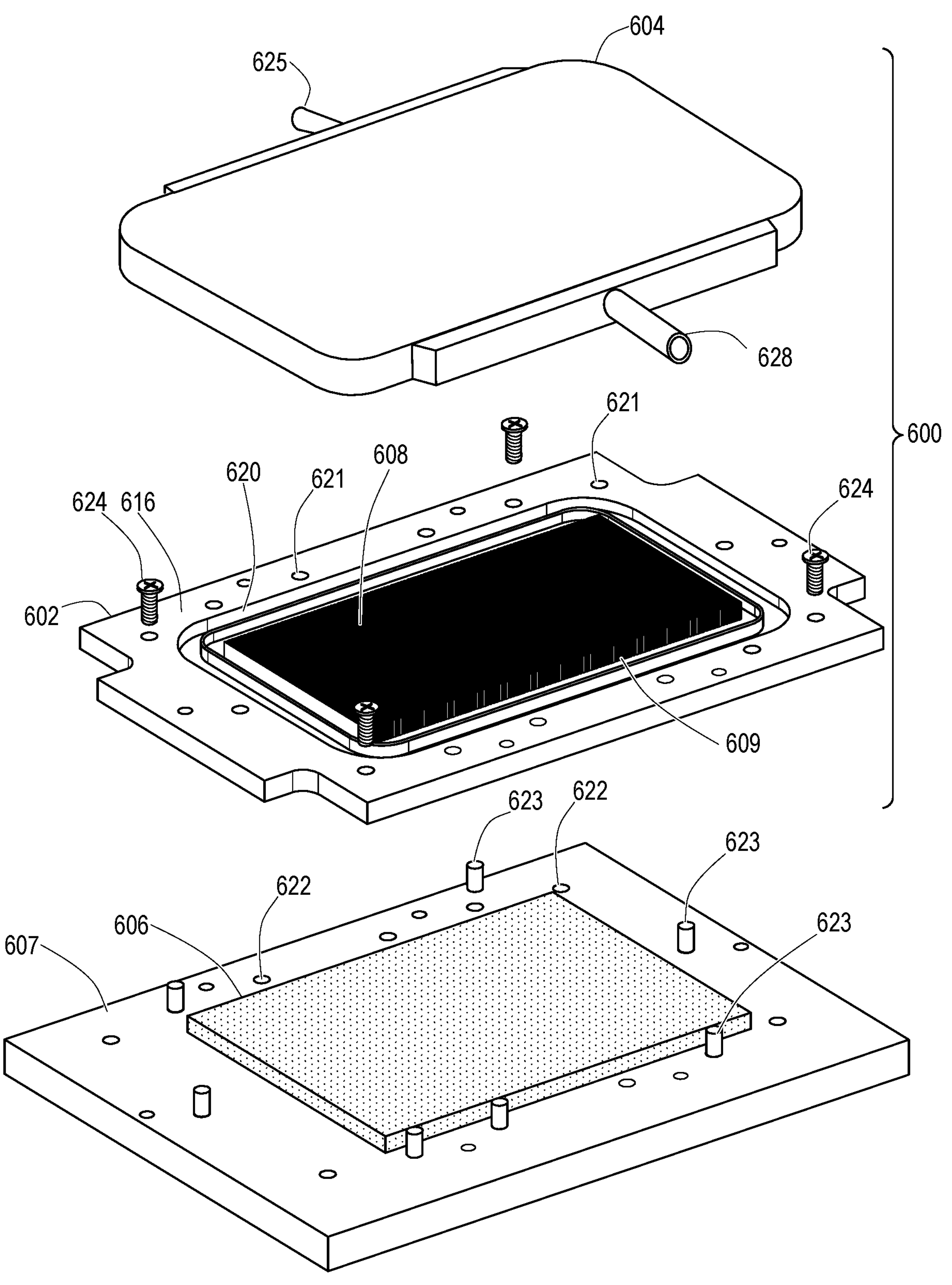
FIG. 6 presents a three-dimensional disassembled view of one example environmentally-hardened cold plate assembly prior to being attached to a heat generating electronic component, the cold plate assembly including an encapsulating lid and a cold plate with an array of extended fins that are coated to enable use with a facility liquid supply as the cooling liquid, according to one or more embodiments.

With reference to FIG. 6, FIG. 4 illustrates a more detailed node-view of IPS rack 301 having IPS node 310 that includes an IPS with heat generating components, which are cooled via one or more of cold plate assembly (see 600, FIG.

6) that are incorporated in each IPS node 310 (FIG. 3) that utilizes liquid cooling to cool heat generating electronic component 606 (FIG. 6). FIG. 4 specifically presents node-level liquid cooling sensors 410 monitored and reported by node microprocessor 412. FIG. 4 further illustrates augmentation of liquid cooling of heat-generating electronic component 606 by air cooling capabilities, such as fans. In one or more embodiments, IPS node 310 includes internal liquid cooling flow controls to optimize liquid cooling to particular heat-generating electronic component 606 within IPS 205 and to mitigate leaks within IPS node 310. In an example, node supply control valve 414 may be a proportion or binary electrically actuated valve that controls supply liquid received by IPS node 310 from supply manifold 102. In another example, node return control valves 416 may be a proportion or binary electrically actuated valves that controls return liquid exhausted by IPS node 310 to return manifold 104. With regard to node-level sensing, Node supply and return control valves 414 and 416 may be directly controlled by node microprocessor 412 or by an active one of primary and secondary manifold control units 130*a*-130*b*. Examples of node-level liquid cooling sensors 410 may include node supply pressure ("SP") sensor 446, node supply flow ("SF") rate sensor 448, and node supply temperature ("ST") sensor 450, positioned upstream of cold plate assembly 600. Examples of node-level liquid cooling sensors 410 may further include node leak detector ("SD") sensor 452 and surface temperature ("T") sensors 454, which are in thermally conductive contact to heat generating electronic components 406 and 606, which are respectively either air cooled or liquid cooled. Examples of node-level liquid cooling sensors 410 may also include return pressure ("RP") sensor 456, return flow ("RF") rate sensor 458, and return temperature ("RT") sensor 460.

Air cooling capabilities of IPS node 310 may be supported by additional node-level liquid cooling sensors 410 such as ambient air temperature sensor 462, which detects cooling air 464 entering air intake vent 466 moved through IPS node 310 to exit from exhaust vent 468 by air mover 470 to cool heat-generating electronic components 406. Exhausted air may pass through liquid-to-air heat exchangers 472 to transfer thermal energy from heated cooling liquid before exhausting the liquid to return manifold 104. Alternatively, liquid-to-air heat exchanger 472 may be used to transfer thermal energy to the cooling liquid to reduce ambient air temperature. Node level liquid distribution conduits 474 and node return control valves 416 may control amounts of heated cooling liquid that passes through liquid-to-air heat exchangers 472. Node-level liquid cooling sensors 410 may include exhaust air temperature ("ET") 476 positioned to detect exhaust air temperature such as exhaust vent 468 before liquid-to-air heat exchangers 472 or after exiting liquid-to-air heat exchangers 472.

Figure 5:
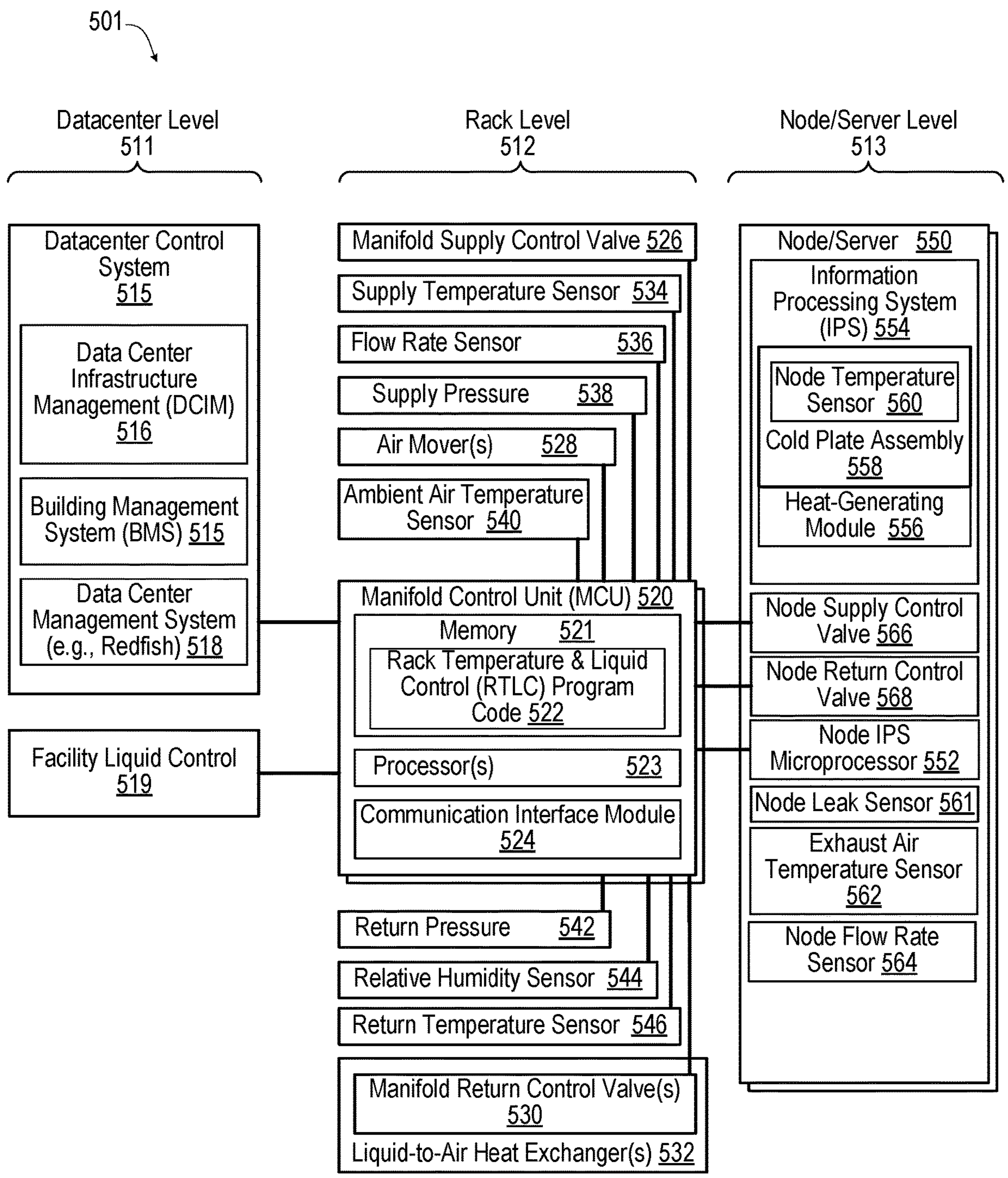
FIG. 5 is a functional bock diagram of an example liquid cooling control system having datacenter level, rack level, and node level liquid cooling control and telemetry, according to one or more embodiments.

FIG. 5 is a functional bock diagram of example liquid cooling control system 501 having datacenter level, rack level, and node level liquid cooling control and telemetry 511, 512, and 513. Datacenter level liquid cooling control and telemetry 511 includes datacenter control system 515, which may include data center infrastructure management (DCIM) 516, building management system (BMS) 515, and data center management system (e.g., Redfish) 518. Datacenter level liquid cooling control and telemetry 511 also includes facility liquid control 519.

Rack level liquid cooling control and telemetry 512 is managed by MCU 520 having memory 521, processor 523, and communication interface module 524. Memory 521 contains rack temperature and liquid control (RTLC) program code 522. When RTLC program code 522 is executed by processor(s) 523, RTLC program code 522 configures MCU 520 to perform functionality described herein via communication interface module 524. MCU 520 operably controls manifold supply control valve 526, air mover(s) 528, and manifold return control valve(s) 530 that regulate liquid-to-air heat exchangers 532. MCU 520 monitors sensors such as supply temperature sensor 534, flow rate sensor 536, supply pressure sensor 538, ambient air temperature sensor 540, return pressure sensor 542, relative humidity sensor 544, and return temperature sensor 546.

Node level liquid cooling control and telemetry 513 is supported by node 550 as managed by node IPS microprocessor 552 that is resident at corresponding node 550 and remotely supervised by MCU 520. Node 550 includes IPS 554 having heat-generating electronic component 556 that is cooled by cold plate assembly 558. Node temperature sensor 560 is positioned and configured to detect node-level cooling telemetry of cold plate assembly 558. In addition to node temperature sensor 560, node IPS microprocessor 552 monitors other node-level sensors such as node leak sensor 561, exhaust air temperature sensor 562, and node flow rate sensor 564. Node IPS microprocessor 552 or MCU 520 control node supply control valve 566 and node return control valve 568.

Figure 7:
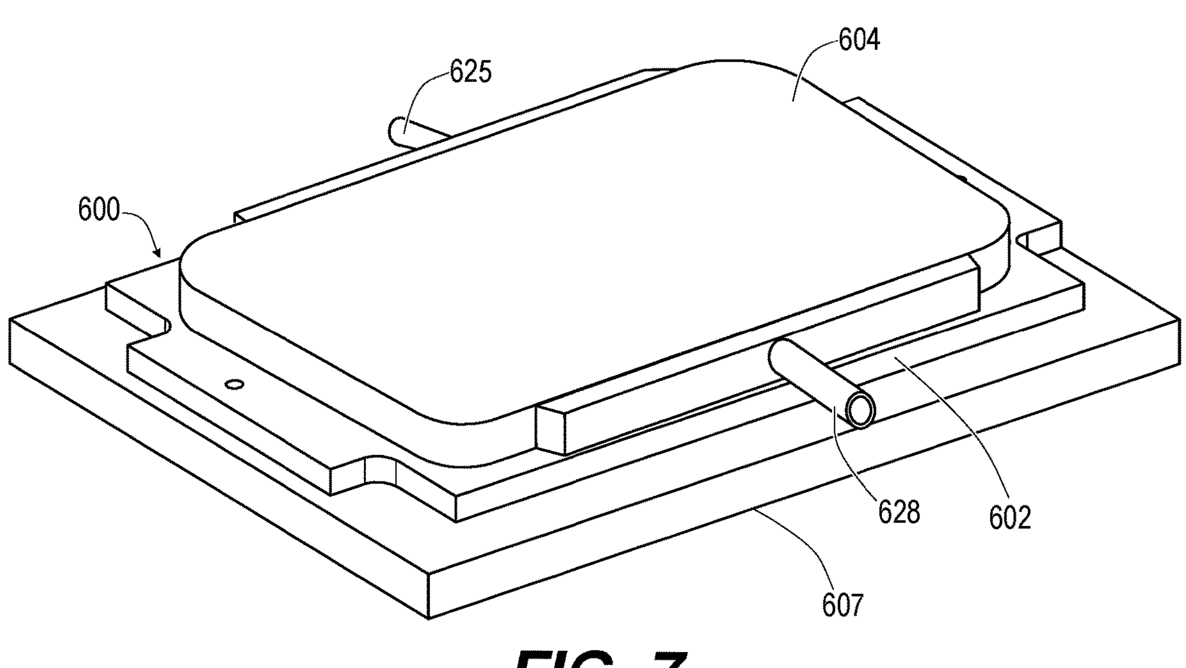
FIG. 7 is a three-dimensional view of the cold plate assembly attached to the heat generating electronic component of FIG. 6, according to one or more embodiments.

FIG. 6 presents a three-dimensional disassembled view of example cold plate assembly 600 including cold plate 602 and encapsulating lid 604 positioned above heat generating electronic component 606, which receives liquid cooling via the cold plate assembly 600. In an example embodiment, heat generating electronic component 606 is an integrated circuit module, such as a central processing unit (CPU) or graphics processing unit (GPU) on substrate 607 (e.g., a circuit board). In another example embodiment, heat generating electronic component 606 is an electrical power conversion or regulation component. FIG. 7 is a three-dimensional view of the assembled cold plate assembly 600 attached substrate 607 to hold to heat generating electronic component 606 (FIG. 6) into thermal contact with cold plate 602. With particular reference to FIG. 6, example cold plate 602 is formed from a conductive material such as copper that is environmentally hardened, such as in physical vapor deposition (PVD) apparatus described below with regard to FIG. 9, to withstand fouling and/or clogging due to direct use of facility water to provide liquid cooling. Cold plate 602 includes an array of extended fins 608 that present intervening microchannels 609 for liquid passage/flow when the cold plate assembly 600 is assembled and connected to a source of liquid flow. Encapsulating lid includes intake port 625 and exhaust port 628. Additional features of cold plate assembly 600 of FIG. 6 will be described with reference to FIGS. 8 and 9.

Figure 8:
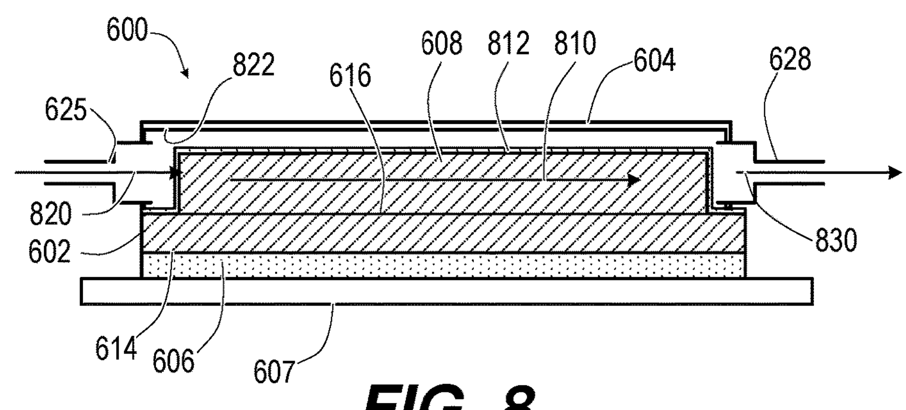
FIG. 8 is a side cutaway view of the cold plate assembly attached to the heat generating electronic component of FIG. 6 and presenting one coated fin extended in the direction of the cooling liquid flow, according to one or more embodiments.
Figure 9:
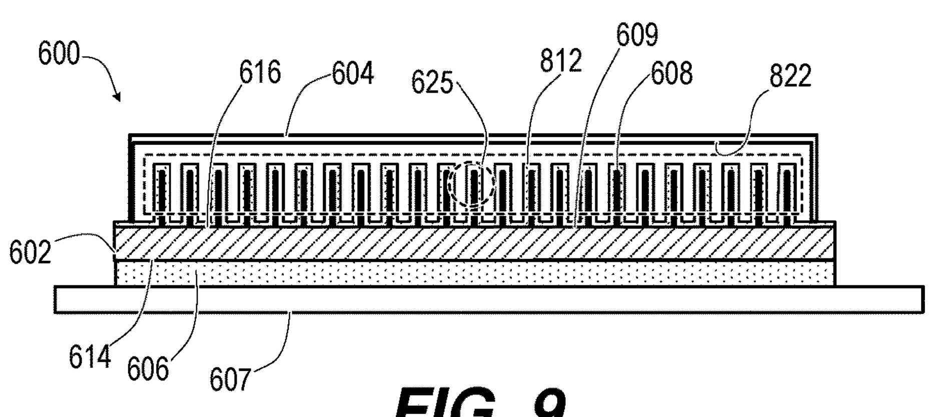
FIG. 9 is a front cutaway view of the cold plate assembly attached to the heat generating electronic component of FIG. 6 and showing the protective coating on each of the array of extended fins and the intervening channels between adjacent fins, according to one or more embodiments.

FIG. 8 is a side cutaway view of cold plate assembly 600 attached to heat generating electronic component 606 and presenting fin 608 extended in the direction of the cooling liquid flow 810. FIG. 9 is a front cutaway view of cold plate assembly 600 attached to heat generating electronic component 606 and showing protective coating 812 on each of the array of extended fins 608 and intervening microchannels 609 between adjacent fins 608. With reference to FIGS. 8-9 and ongoing reference to FIG. 6, first surface 614 of cold plate 602 provides a heat receiving surface configured to dissipate thermal energy from attached heat generating electronic component 606. With particular reference to FIG. 6, second surface 616 of cold plate 602 is opposite to first surface 614 and provides a heat transferring surface. Second surface 616 is configured with an array of extended fins 608, which may also be referred to as "ribs" or microchannels, to increase convective surface area of the heat transferring surface. Extended fins 608 form or provide microchannels 609 in the conductive material that that are aligned to receive a flow of the cooling liquid, such as water, which contacts and absorbs heat away from the adjacent fins 608. Second surface 616 includes perimeter 620 around the array of extended fins 608 for mounting of encapsulating lid 604. In one or more embodiments, perimeter 620 is recessed into second surface 616 to facilitate sealing attachment of encapsulating lid 604 to cold plate 602. Sealably attaching encapsulating lid 604 to cold plate 602 may include use of one or more of a press-fit interference attachment, an adhesive layer, soldering, brazing, welding, and a fastener attachment.

Through holes 621 pass orthogonally through first and second surfaces 614 (FIG. 8) and 616 of cold plate 602. A subset of holes 622 in substrate 607 receive guide pins 623 that are aligned with corresponding through holes 621 in cold plate 602 to guide assembly of cold plate 602 to substrate 607. Holes 622 in substrate 607 surrounding heat generating component 606 align with other through holes 621 for receiving a respective machine screw 624 to attach cold plate assembly 600 to substrate 607.

According to one additional aspect, cold plate 602 is constructed with flow plate geometry that is designed to prevent flow obstruction by particulate suspended in the liquid coolant. The geometry of the cold plate flow passages (microchannels 609) is designed to promote heat transfer efficiency that is similar to conventional electronic cooling cold plates typically manufactured from bare copper or nickel-plated copper. The array of extended fins 608 may be spaced apart at least 800-microns to facilitate passage of the facility liquid particulates. In one or more embodiments, in manufacturing the cold plate, a geometry of each fin 608 within the array of extended fins 608 may be configured to maintain large hydraulic diameters with greater than 800-micron flow spaces. Unlike conventional devices, cold plate 602 with protective surface coating 812 is tolerant of poorly controlled water quality (including from both chemical contaminants and particulates).

With particular reference to FIGS. 8 and 9, encapsulating lid 604 of cold plate assembly 600 is attachable to second surface 616, encompassing at least the array of extended fins 608 with protective coating 812 to form liquid cooling cavity 822. Encapsulating lid 604 includes intake port 625 positioned to direct incoming liquid flow 820 across second surface 616 through the array of extended fins 608. Encapsulating lid 604 includes exhaust port 628 to direct heated liquid flow 830 exiting the array of extended fins 608 away from cold plate assembly 600. In one or more embodiments, intake port 625 and exhaust port 628 are on opposite sides of encapsulating lid 604 to cooperate in aligning liquid flows 810, 820 and 830. In one or more alternate embodiments, intake port 625 and exhaust port 628 may be adjacently positioned on the same side of encapsulating lid 604. In one or more alternate embodiments, intake port 625 and exhaust port 628 may be orthogonally positioned respectively on two adjacent sides of encapsulating lid 604. Intake port 625, exhaust port 628, and intervening volumetric space of liquid cooling cavity 822 may be configured to maintain a flow velocity of at least 0.7 m/s of liquid impinging the array of extended fins 608 to prevent sedimentation.

Figure 10:
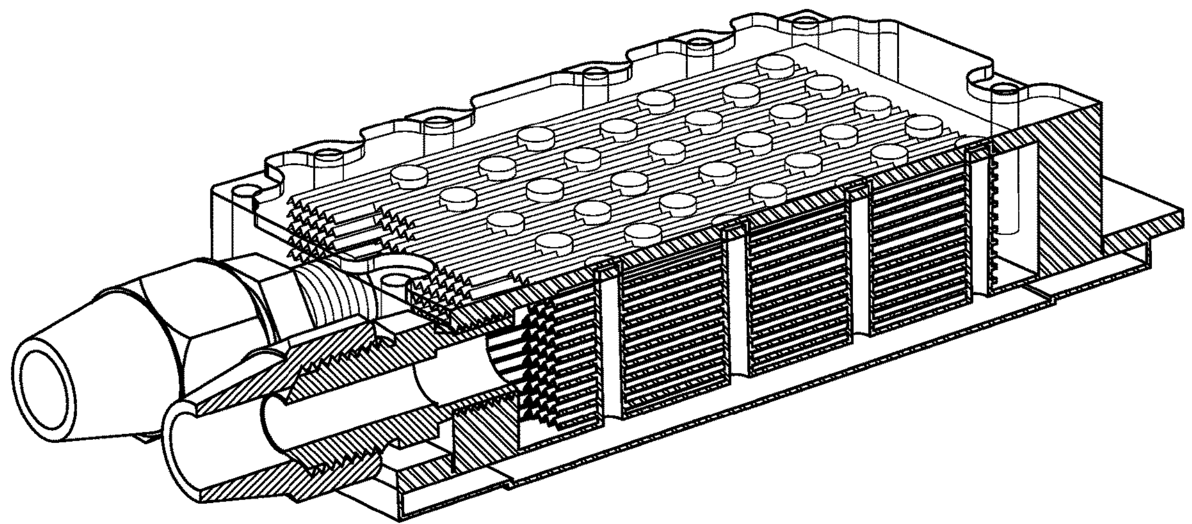
FIG. 10 is a three-dimensional view of an alternative cold plate assembly incorporating a fin stack assembly to increase convection thermal transfer, according to one or more embodiments.

FIG. 10 is a three-dimensional cut-away side view of an alternative cold plate assembly 1000 incorporating fin stack assembly 102 with 3D vapor chambers to increase convection thermal transfer. Cold plate assembly 1000 includes cold plate 1002 formed of a thermally conductive material. Cold plate 1002 has first surface attachable to a heat generating electronic component of an information processing system. Cold plate 1002 has second surface 1010, opposite to the first surface, that includes an array of more than one riser columns 1011 extending orthogonally from second surface 1010 of cold plate 1002. Cold plate assembly 1000 includes stacked arrangement of two or more levels of fins 1013 to form fin stack 1015. Fins 1013 are physically attached to at least one of the more than one riser columns 1011 perpendicular to the at least one of the more than one riser columns 1011. The two or more levels of fin 1013 of fin stack 1015 are spaced apart, substantially in parallel with each other and with second surface 1010. Cold plate assembly 1000 includes encapsulating lid 1004 attachable to second surface 1010 to form liquid cooling cavity 1022 that encloses fin stack 1015. Encapsulating lid 1004 includes intake port 1025 and exhaust port 1028 that are laterally positioned and aligned with fin stack 1015 to create liquid flow through fin stack 1015 for liquid cooling.

In one or more embodiments, each riser column is a hollow pipe filled with a working fluid to support thermal convection through evaporation and condensation in addition to thermal conduction away from the heat generating electronic component. In one or more embodiments, each of the one or more fins 1013 of fin stack 1015 have a flat geometric shape configured to increase rate of liquid flow through fin stack 1015 and mitigate sedimentation and scaling. In one or more embodiments, each of the one or more fins 1013 of fin stack 1015 have a non-flat geometric shape configured to increase convection heat transfer performance. In one or more particular embodiments, each of the one or more fins 1013 of fin stack 1015 are an annular disk attached to a single one of the more than one riser columns 1011.

In one or more embodiments, the thermally conductive material of cold plate 1002 is copper. Second surface 1010, the more than one riser columns 1011, and the more than one fins 1013 are coated with at least one material that is one or more of hydrophobic, nonconductive, and anti-corrosive to enable use of facility water as a cooling liquid. In one or more embodiments, the more than one levels of fins 1013 of fin stack 1015 are spaced apart at least 800 microns and encapsulating lid 1004 is configured to maintain a flow velocity of at least 0.7 m/s of liquid impinging fin stack 1015 to prevent sedimentation within fin stack 1015.

Figure 11:
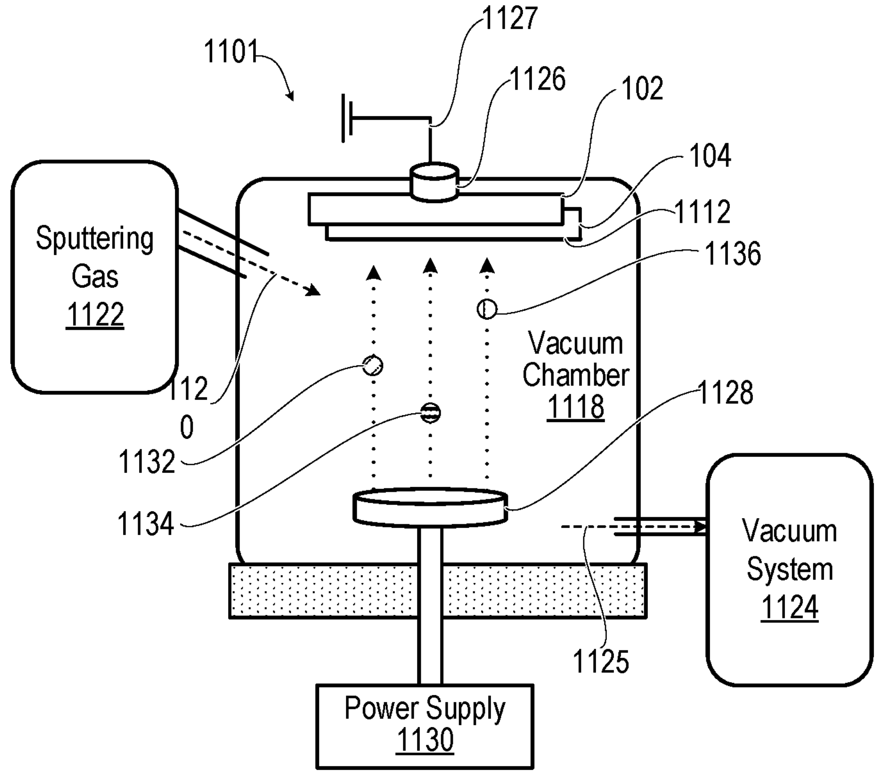
FIG. 11 illustrates a physical vapor deposition (PVD) process for covering a cold plate, supply manifold, or return manifold of the RLCM system of FIG. 1 with a protective coating, which enables use of facility-grade cooling liquids by protecting the wetted surfaces and the cold plate from damage, deterioration, and/or clogging due to exposure to facility-grade cooling liquids, according to one or more embodiments.

FIG. 11 presents an example physical vapor deposition (PVD) process by which protective coating 1112 can be deposited on a pretreated version of wetted surfaces of supply manifold 102 and return manifold 104 to generate/manufacture environmentally hardened (or coated) tubular components to protect the wetted surfaces of RLCM system from damage, deterioration, and/or clogging due to exposure to facility-grade cooling liquids that can contain corrosive chemical and particulate contaminants. The environmental hardening prevents supply manifold 102 and return manifold 104 from introducing corrosion or particles into the cooling system that may degrade liquid cooling performance of other components, such as cold plate assembly 102 (FIG. 6) or cold plate assembly 1000 (FIG. 10). To facilitate use of a facility cooling liquid, such as unpurified water, supply manifold 102 and return manifold 104 are environmentally hardened, such as by applying a coating 1112 deposited to wetted surfaces of supply manifold 102 and return manifold 104 in physical vapor deposition (PVD) apparatus 1101. PVD apparatus 1101 includes vapor chamber 1118 that is filled with sputtering gas 1120 received from sputtering gas supply 1122 and that is maintained at an appropriate pressure by vacuum system 1124 that removes excess gas 1125. Wetted internal surfaces of supply manifold 102 and return manifold 104 are oriented toward target 1128, which includes one or more coating materials to be deposited onto supply manifold 102 and return manifold 104 by PVD. Target 1128 is connected to power supply 1130 to cause ionization of sputtered atoms 1132, 1134, and 1136, which are attracted by the voltage difference between target 1128 and supply manifold 102 and return manifold 104 to that transit across vacuum chamber 1118 and be deposited onto supply manifold 102 and return manifold 104 to form coating 1112. In an example, first atom 1132 represents a hydrophobic material, second atom 1134 represents a non-conductive material, and third atom 1136 1132 represents an anti-corrosive material. Wetted surfaces (i.e., flow passages) of supply manifold 102 and return manifold 104 are coated with non-conductive, anti-corrosion surface enhancements such as Zirconium Nitride, Titanium Nitride, and other ceramics applied by PVD. In one or more embodiments, the surface may also be coated with a hydrophobic surface treatment to mitigate scale and sedimentation. It is appreciated that while the coating process is shown to be completed by PVD, other similar techniques can be utilized to provide the coating layer(s) on the first surface of cold plate to yield the various physical and chemical enhancements that are described herein. The specific description of PVD as the process is thus not intended to be limiting on the scope of the disclosure. In one or more alternate embodiments, conduits and other wetted surface of supply manifold 102 and return manifold 104 are environmentally hardened by submersion to incorporate surface treatments for environmental hardening.

Facility water, which may contain corrosive chemical and particulate contaminants would be suboptimal for liquid cooling using conventional cold plates. In one or more embodiments, the protective coating applied to wetted surfaces of supply and return manifolds and cold plate assembly 102 (FIG. 6) or cold plate assembly 1000 (FIG. 10) by the above-described PVD process provides one or more protective characteristics, including: (i) a hydrophobic characteristic to mitigate scaling by calcium carbonate, (ii) an anti-corrosive characteristic to mitigate formation corrosion, and (iii) a non-conductive characteristic to mitigate rusting. Supply manifold 102 and return manifold 104 with coating 1112 is designed to resist heat-transfer inhibiting failure modes common to liquid cooling with poorly regulated water quality, namely suspended solid particulates, biological growth potential, and harsh water chemistry conditions, including semi-corrosive mixtures.

Figure 12A:
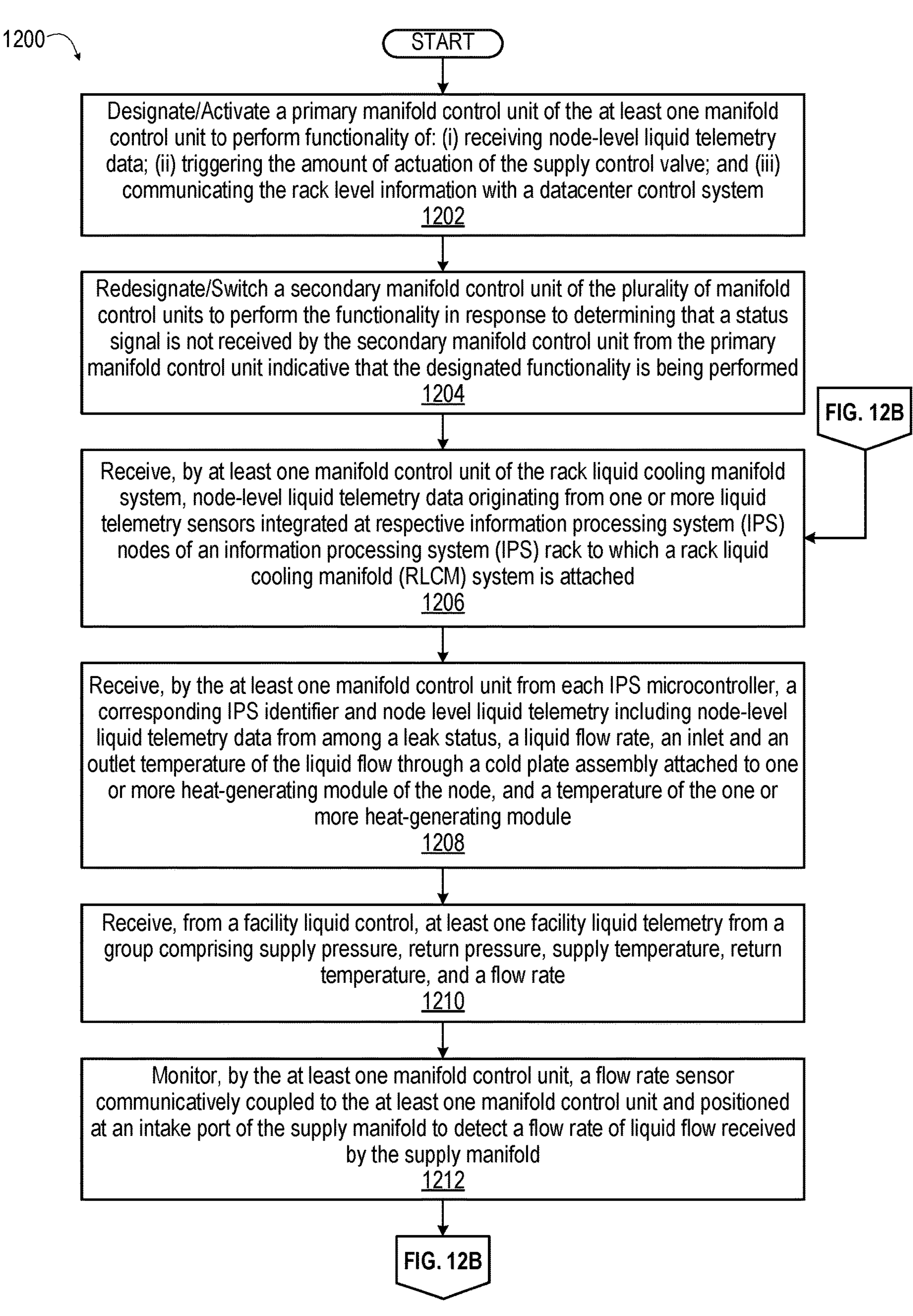
FIGS. 12A-12B (collectively "FIG. 12") are a flow diagram presenting a method of controlling liquid cooling of information processing system nodes in an information processing system rack via a rack liquid cooling manifold system, according to one or more embodiments.
Figure 12B:
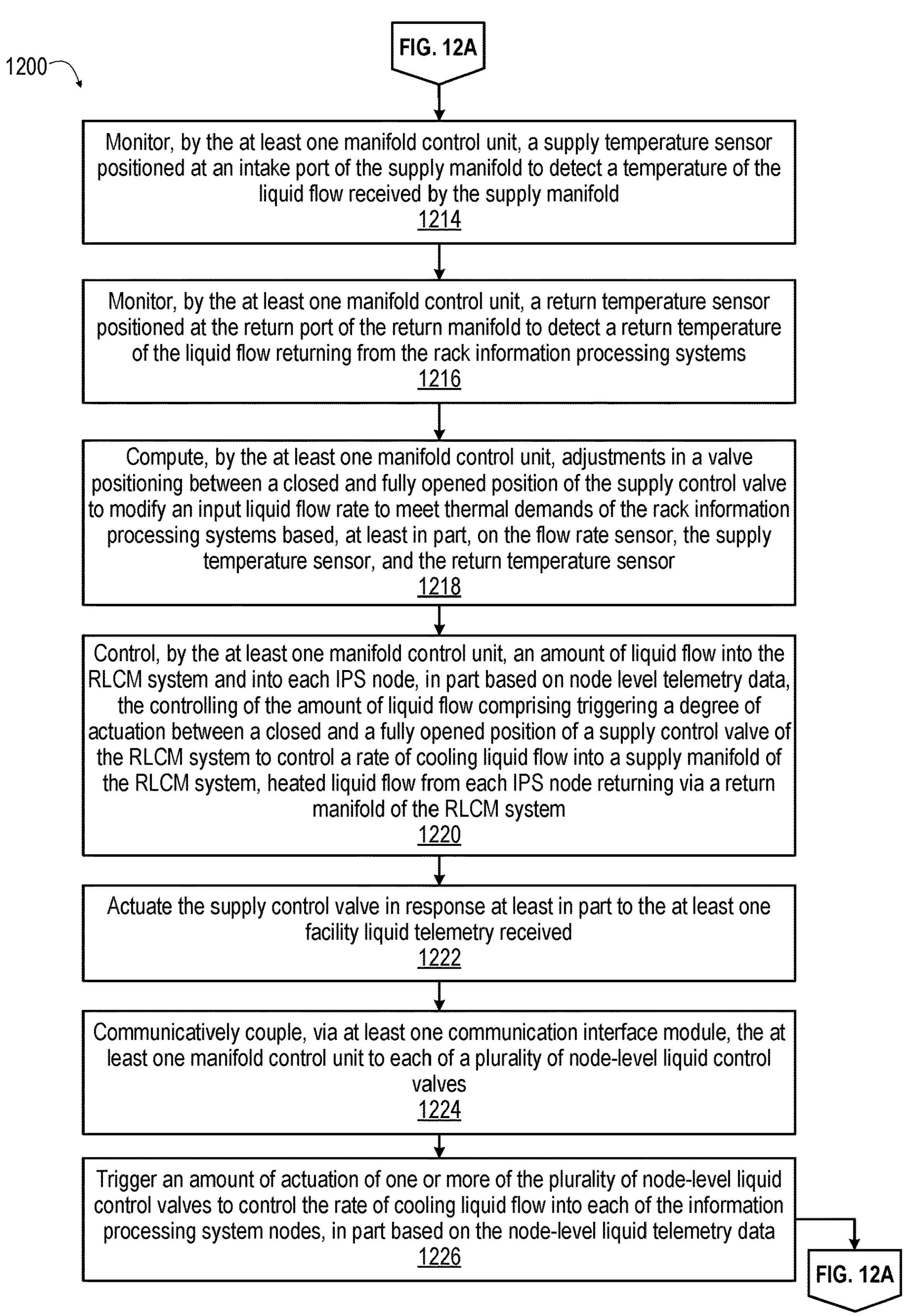
Figure 13:
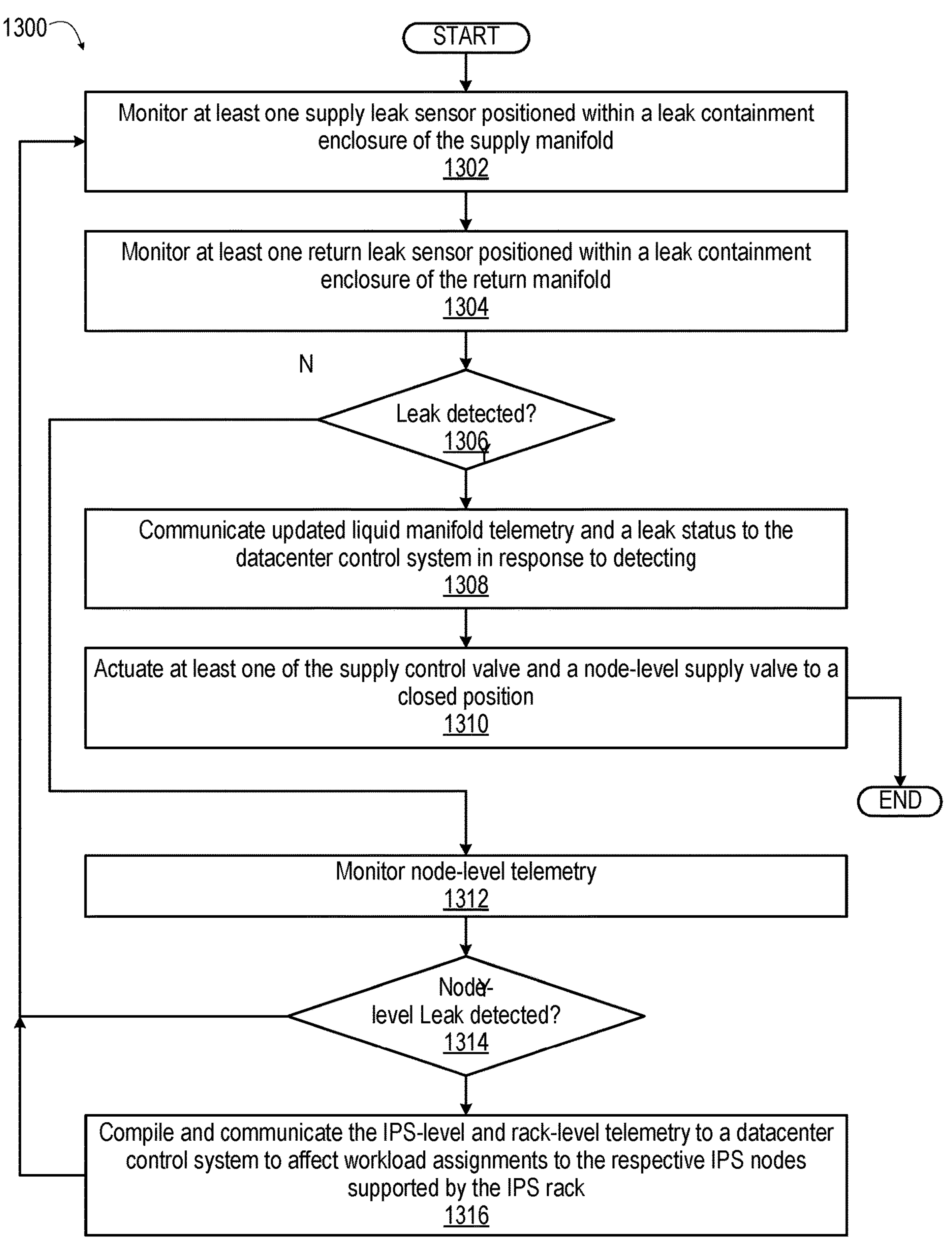
FIG. 13 is a flow diagram presenting a method of augmenting the method of FIG. 12 with at least rack-level leak detection telemetry and control, according to one or more embodiments.
Figure 14:
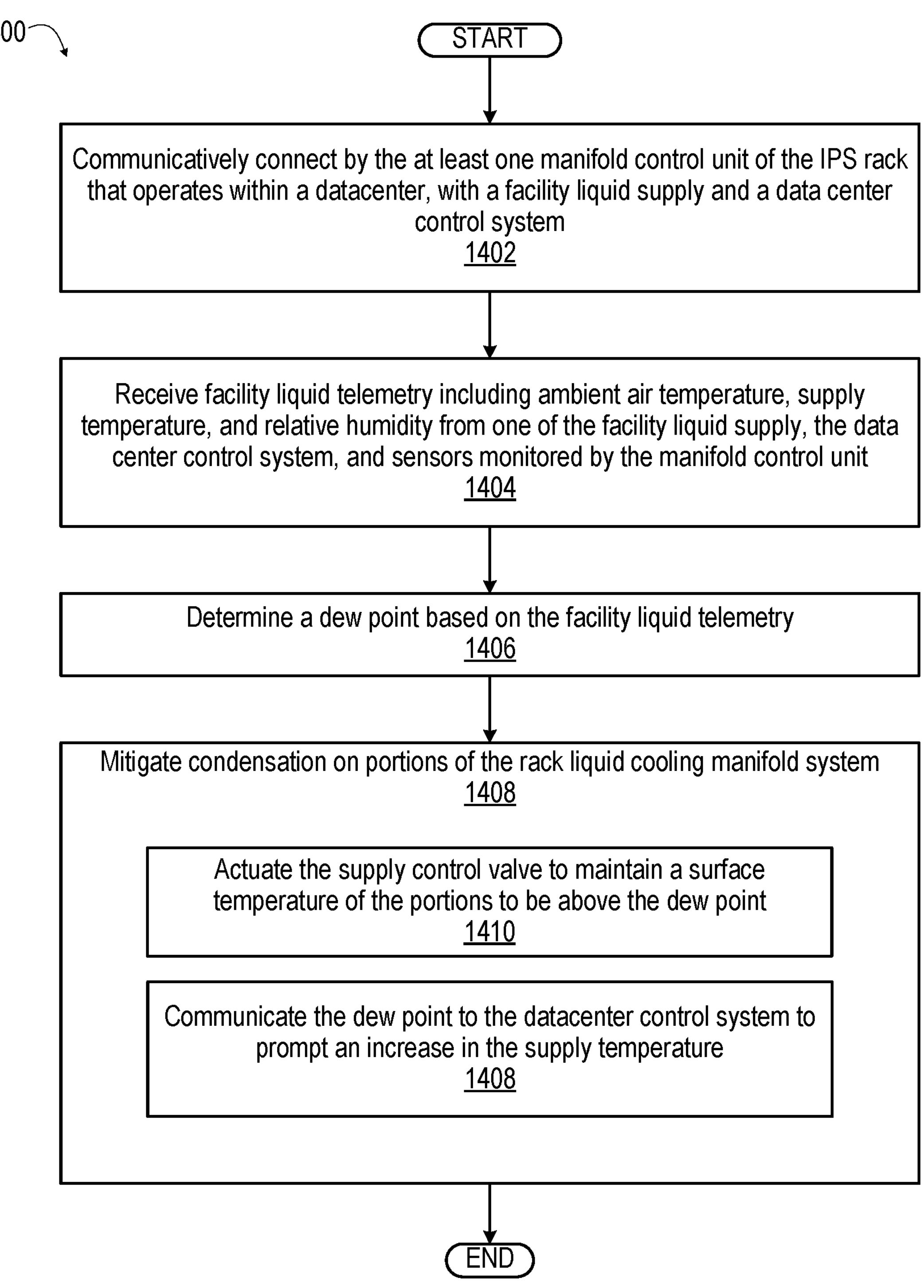
FIG. 14 is a flow diagram presenting a method of augmenting the method of FIG. 12 with condensation prevention by communicating dew point telemetry to a datacenter control and system and rack-level liquid cooling control, according to one or more embodiments.
Figure 15:
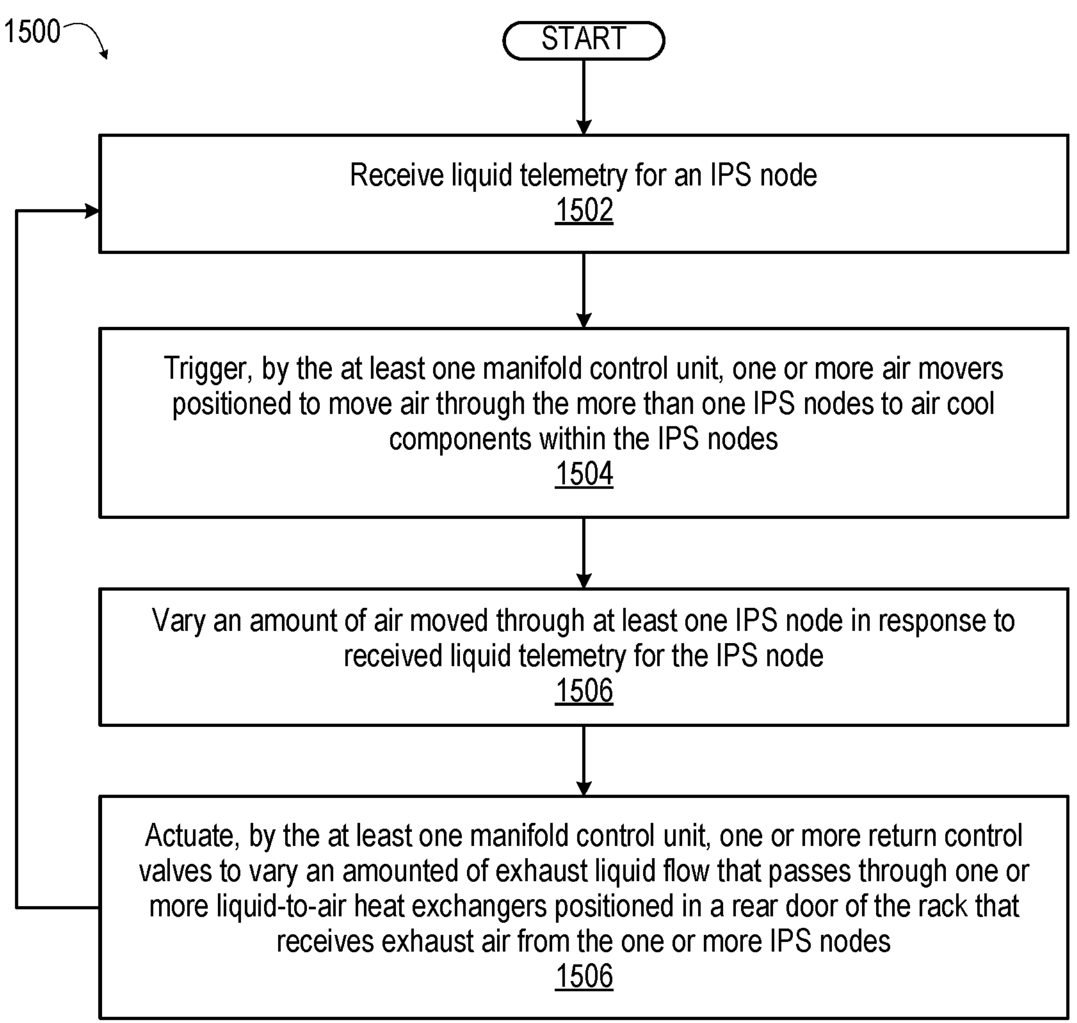
FIG. 15 is a flow diagram presenting a method of augmenting the method of FIG. 12 with air cooling of other heat generating electronic components in the information processing system rack and dissipating thermal energy from the rack liquid cooling manifold system to at least one rack rear liquid-to-air heat exchanger, according to one or more embodiments.

FIGS. 12A-12B (collectively "FIG. 12") are a flow diagram presenting method 1200 of controlling liquid cooling of information processing system nodes in an information processing system rack via a smart rack liquid cooling manifold system. FIG. 13 is a flow diagram presenting method 1300 of augmenting method 1200 with at least rack-level leak detection telemetry and control. FIG. 14 is a flow diagram presenting method 1400 of augmenting method 1200 with condensation prevention by dew point telemetry to a datacenter control and system and rack-level liquid cooling control. FIG. 15 is a flow diagram presenting method 1600 of augmenting method 1200 with air cooling of other heat generating electronic components in the information processing system rack and dissipating thermal energy from the rack liquid cooling manifold system to at least one rack rear liquid-to-air heat exchanger. The descriptions of method 1200 (FIG. 12), method 1300 (FIG. 13), method 1400 (FIG. 14), and method 1500 (FIG. 15) are provided with general reference to the specific components illustrated within the preceding FIGS. 1-11. Specific components referenced in method 1200 (FIG. 12), method 1300 (FIG. 13), method 1400 (FIG. 14), and method 1500 (FIG. 15) may be identical or similar to components of the same name used in describing preceding FIGS. 1-11. In one or more embodiments, a controller such as manifold control unit (MCU) 130 (FIGS. 1-2) or a similar computing device provides the described functionality of method 1200 (FIG. 12), method 1300 (FIG. 13), method 1400 (FIG. 14), and method 1500 (FIG. 15).

With reference to FIG. 12A, in one or more embodiments, the at least one manifold control unit 130 includes a plurality of manifold control units, e.g., primary MCU 130*a* and secondary MCU 130*b*, that are programmed to decide on activation of one of the plurality of manifold control units to perform the various functionality described herein. In a particular one or more embodiments, method 1200 includes designating or self-nominating of or activating a primary manifold control unit of the at least one manifold control unit to perform primary manifold functionality of: (i) receiving node-level liquid telemetry data; (ii) triggering the amount of actuation of the supply control valve; and (iii) communicating the rack level information with a datacenter control system (block 1202). In one or more embodiments, method 1200 includes Method 1200 includes monitoring, by a designated secondary MCU, for receipt of an indication of an error status/signal from/about the primary MCU (block 1204) and determining at decision block 1205 whether the indication is received. The primary MCU continues to operate as the primary until an indication is received. In response to receiving the indication that the primary MCU is presenting an error message or is in the error status, method 1200 includes redesignating a secondary MCU of the plurality of manifold control units to assume the role of primary MCU and perform the functionality of a primary MCU (block 1206). In one or more embodiments, redesignation of includes switching performance of the primary manifold functionality to the secondary MCU. In one or more embodiments, the secondary MCU assumes the role of the primary MCU in response to determining that a status signal is not received by the secondary MCU from the primary manifold control unit by a specific time period, which is indicative that the primary MCU cannot perform the designated primary MCU functionality.

In one or more embodiments, method 1200 includes receiving, by at least one manifold control unit of the rack liquid cooling manifold system, node-level liquid telemetry data originating from one or more liquid telemetry sensors integrated at respective information processing system (IPS) nodes of an IPS rack to which a rack liquid cooling manifold (RLCM) system is attached (block 1208). The at least one manifold control unit is integrated with and attached to the rack liquid cooling manifold system.

In one or more embodiments, the RLMC system 100 includes a plurality of integrated connectors enabling node-level connection and communication. Each IPS node includes an IPS microcontroller that is communicatively coupled to one of the plurality of integrated connectors and which monitors one or more liquid telemetry sensors within a corresponding information processing system node.

In one or more embodiments, the RLMC rack includes a rack frame, which is divided into a plurality of rungs, each rung providing an IPS node. The IPS is within the IPS node and has one or more heat generating electronic component and at least one environmentally-hardened cold plate assembly attached to one or more heat-generating electronic components to thermally cool one or more heat-generating electronic components via a cooling liquid flow. The RLCM system includes a supply manifold having a plurality of IPS node supply ports and a return manifold having a plurality of IPS node return ports. A first IPS node supply port is sealably attached to an input port of a cold plate assembly and a first IPS node return port is sealable attached to a corresponding exhaust port of the cold plate assembly to channel cooling liquid received from a facility liquid supply through the cold plate assembly.

In one or more particular embodiments, the supply manifold includes a supply control valve and a manifold intake port available for sealably coupling to a facility liquid supply to receive a cooling liquid and includes more than one server supply ports each available for sealably coupling, for liquid transfer of the cooling liquid, to a respective cooling liquid supply input of a corresponding information processing system node. The return manifold includes a facility liquid return port for sealably coupling to a facility return to exhaust the cooling liquid and includes more than one server return ports, each available for sealably coupling, for exhaust liquid transfer, to a respective cooling liquid exhaust output of the corresponding information processing system node. The cooling liquid exhaust output is paired with a corresponding supply liquid cooling input directing cooling liquid flow through the one or more cold plate assembly positioned within the corresponding IPS node to thermally cool the one or more heat-generating electronic components.

With continued reference to FIG. 12A, method 1200 includes receiving, by the at least one manifold control unit from each IPS microcontroller, a corresponding IPS identifier and node level liquid telemetry including node-level liquid telemetry data from among a leak status, a liquid flow rate, an inlet and an outlet temperature of the liquid flow through a cold plate assembly attached to one or more heat-generating electronic component of the node, and a temperature of the one or more heat-generating electronic component (block 1208). In one or more embodiments, method 1200 includes receiving, from a facility liquid control, at least one facility liquid telemetry from a group comprising supply pressure, return pressure, supply temperature, return temperature, and a flow rate (block 1210).

In one or more embodiments, method 1200 includes monitoring, by the at least one manifold control unit, a flow rate sensor communicatively coupled to the at least one manifold control unit and positioned at an intake port of the supply manifold to detect a flow rate of cooling liquid flow received by the supply manifold (block 1212). Method 1200 proceeds to block 1214 of FIG. 12B.

With reference to FIG. 12B, method 1200 includes monitoring, by the at least one manifold control unit, a supply temperature sensor positioned at an intake port of the supply manifold to detect a temperature of the liquid flow received by the supply manifold (block 1214). Method 1200 includes monitoring, by the at least one manifold control unit, a return temperature sensor positioned at the return port of the return manifold to detect a return temperature of the liquid flow returning from the rack information processing systems (block 1216). Method 1200 includes computing, by the at least one manifold control unit, adjustments in a valve positioning between a closed and fully opened position of the supply control valve to modify an input liquid flow rate to meet thermal demands of the rack information processing systems based, at least in part, on the flow rate sensor, the supply temperature sensor, and the return temperature sensor (block 1218). Method 1200 includes controlling, by the at least one manifold control unit, an amount of liquid flow into the RLCM system and into each IPS node, in part based on node level telemetry data, the controlling of the amount of liquid flow including triggering a degree of actuation between a closed and a fully opened position of a supply control valve of the RLCM system to control a rate of cooling liquid flow into a supply manifold of the RLCM system, and a rate of heated liquid flow from each IPS node returning via a return manifold of the RLCM system (block 1220). Method 1200 includes actuating the supply control valve in response at least in part to the at least one facility liquid telemetry received (block 1222). Method 1200 includes communicatively coupling, via at least one communication interface electronic component, the at least one manifold control unit to each of a plurality of node-level liquid control valves (block 1224). Method 1200 includes triggering an amount of actuation of one or more of the plurality of node-level liquid control valves to control the rate of cooling liquid flow into each of the information processing system nodes, in part based on the node-level liquid telemetry data (block 1226). Then method 1200 returns to block 1206 (FIG. 12A).

With reference to FIG. 13, method 1300 includes monitoring at least one supply leak sensor positioned within a leak containment enclosure of the supply manifold (block 1302). Method 1300 includes monitoring at least one return leak sensor positioned within a leak containment enclosure of the return manifold (block 1304). Method 1300 includes determining whether a leak is detected by at least one of the at least one supply leak sensor and the at least one return leak sensor (decision block 1306). In response to determining that a leak is detected by at least one of the at least one supply leak sensor and the at least one return leak sensor, method 1300 includes communicating updated liquid manifold telemetry and a leak status to the datacenter control system (block 1308). Method 1300 includes actuating at least one of the supply control valve and a node-level supply valve to a closed position in response to detecting a leak by one of the at least one supply leak sensor and the at least one return leak sensor (block 1310). Then method 1300 ends. In response to determining that a leak is not detected by at least one of the at least one supply leak sensor and the at least one return leak sensor, method 1300 includes monitoring node-level telemetry (block 1312). Method 1300 includes determining whether a node-level leak detection signal is received from a corresponding server microprocessor (decision block 1314). In response to determining that a node-level leak detection signal is not received, method 1300 returns to block 1302. In response to determining that a node-level leak detection signal is received, method 1300 includes compiling and communicating the IPS-level and rack-level telemetry to a datacenter control system to affect workload assignments to the respective IPS nodes supported by the IPS rack (block 1316). Then, method 1300 returns to block 1302. Method 1300 includes transmitting a signal to the node supply valve to turn the valve to an off position and reporting a valve state (fully off) to the datacenter controller (block 1318).

With reference to FIG. 14, method 1400 includes communicatively connecting by the at least one manifold control unit of the IPS rack that operates within a datacenter, with a facility liquid supply and a data center control system (block 1402). Method 1400 includes receiving facility liquid telemetry including ambient air temperature, supply temperature, and relative humidity from one of the facility liquid supply, the data center control system, and sensors monitored by the manifold control unit (block 1404). Method

1400 includes determining a dew point based on the facility liquid telemetry (block 1406). Method 1400 includes mitigating condensation on portions of the rack liquid cooling manifold system (block 1408). In one example, method 1400 includes mitigating condensation by actuating the supply control valve to maintain a surface temperature of the portions of the rack liquid cooling manifold system to be above the dew point (block 1410). In another example, method 1400 includes mitigating condensation by communicating the dew point to the datacenter control system to prompt an increase in the supply liquid temperature (block 1412). Then method 1400 ends.

With reference to FIG. 15, method 1500 includes receiving liquid telemetry for an IPS node (block 1502). Method 1500 includes triggering, by the at least one manifold control unit, one or more air movers positioned to move air through the more than one IPS nodes to air cool components within the IPS nodes (block 1504). Method 1500 includes varying an amount of air moved through at least one IPS node in response to received liquid telemetry for the IPS node (block 1506). Method 1500 includes actuating, by the at least one manifold control unit, one or more return control valves to vary an amounted of exhaust liquid flow that passes through one or more liquid-to-air heat exchangers positioned in a rear door of the rack that receives exhaust air from the one or more IPS nodes (block 1508). Then method 1500 returns to block 1502.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "component", "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device, or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. A rack liquid cooling manifold system comprising:

a supply manifold comprising a supply control valve and a manifold intake port available for sealably coupling to a facility liquid supply to receive a cooling liquid and comprising more than one server supply ports each available for sealably coupling, for liquid transfer of the cooling liquid, to a respective cooling liquid supply input of a corresponding information processing system node supported by a rack frame capable of supporting multiple information processing system nodes, each having one or more heat-generating electronic components;

a return manifold comprising a facility liquid return port for sealably coupling to a facility return to exhaust the cooling liquid and comprising more than one server return ports, each available for sealably coupling, for exhaust liquid transfer, to a respective cooling liquid exhaust output of the corresponding information processing system node, the respective cooling liquid exhaust output and a paired supply liquid cooling input directing cooling liquid flow through one or more cold plate assembly positioned within the corresponding information processing system node to thermally cool the one or more heat-generating electronic components; and at least one manifold control unit integrated into one of the supply manifold and the return manifold and comprising:

at least one communication interface module configured to communicatively couple the at least one manifold control unit to the supply control valve, and a datacenter control system;

a memory having stored thereon rack temperature and liquid control (RTLC) code; and at least one processor communicatively coupled to the at least one communication interface module and the memory, and which processes instructions of the RTLC code to cause the at least one manifold control unit, while the supply and return manifolds are connected to a rack of information processing systems, to:

receive node-level liquid telemetry data originating from one or more liquid telemetry sensors integrated at a respective information processing system node;

trigger an amount of actuation of the supply control valve to control a rate of cooling liquid flow into the supply manifold, in part based on the node-level liquid telemetry data; and communicate rack level information with the datacenter control system.

2. The rack liquid cooling manifold system of claim 1, wherein the at least one manifold control unit:

receives, from a facility liquid control, at least one facility liquid telemetry from a group comprising supply pressure, return pressure, supply temperature, return temperature, and a flow rate; and actuates the supply control valve in response, at least in part, to the at least one facility liquid telemetry received.

3. The rack liquid cooling manifold system of claim 1, wherein the at least one manifold control unit:

receives facility liquid telemetry comprising ambient air temperature, supply temperature, and relative humidity;

determines a dew point based on the facility liquid telemetry; and mitigates condensation on portions of the rack liquid cooling manifold system by one of: (i) actuating the supply control valve to maintain a surface temperature of the portions to be above the dew point; and (ii) communicating the dew point to the datacenter control system to prompt an increase in the supply temperature.

4. The rack liquid cooling manifold system of claim 1, wherein the at least one communication interface module further comprises: a plurality of connectors integrated along a length of at least one of the supply manifold and the return manifold to allow for connection to and data communication from each information processing system located within the rack with the at least one manifold control unit.

5. The rack liquid cooling manifold system of claim 4, wherein:

each server microcontroller is communicatively coupled to one of a plurality of integrated connectors and monitors one or more liquid telemetry sensors within the corresponding information processing system node to receive the node-level liquid telemetry data; and the at least one manifold control unit receives node-level liquid telemetry comprising the node-level liquid telemetry data from a corresponding server microcontroller.

6. The rack liquid cooling manifold system of claim 5, wherein the at least one manifold control unit receives, from each server microcontroller, a corresponding server identifier and the one or more liquid telemetry for a particular information processing system node from among a leak status, a liquid flow rate, an inlet and an outlet temperature of the liquid flow through a cold plate assembly attached to one or more heat-generating electronic component of the node, and a temperature of the one or more heat-generating electronic component.

7. The rack liquid cooling manifold system of claim 1, wherein:

the at least one communication interface module is further configured to communicatively couple the at least one manifold control unit to each of a plurality of node-level liquid control valves; and the at least one processor processes the instructions of the RTLC code to cause the at least one manifold control unit, while the supply and return manifolds are connected to the rack of information processing systems, to trigger an amount of actuation of one or more of the plurality of node-level liquid control valves to control the rate of cooling liquid flow into each of the information processing system nodes, in part based on the node-level liquid telemetry data.

8. The rack liquid cooling manifold system of claim 1, wherein the RTLC code configures the at least one manifold control unit to:

generate server-level telemetry based on data received from the more than one liquid telemetry sensors via a server microcontroller; and communicate the server-level telemetry to a datacenter control system to affect workload assignments to the respective information processing system nodes supported by the rack.

9. The rack liquid cooling manifold system of claim 8, wherein:

the supply manifold comprises a leak containment enclosure and at least one supply leak sensor;

the return manifold comprises a leak containment enclosure and at least one return leak sensor; and the at least one manifold control unit is communicatively coupled to the at least one supply leak sensor and the at least one return leak sensor, and the RTLC code configures the at least one manifold control unit to:

communicate updated liquid manifold telemetry and a leak status to the data control system in response to detecting the leak; and actuate the supply control valve to a closed position in response to detecting a leak based on the at least one supply leak sensor and the at least one return leak sensor.

10. The rack liquid cooling manifold system of claim 1, wherein the RTLC code configures the at least one manifold control unit to communicatively connect to a plurality of different datacenter control systems from among a group comprising a data center infrastructure management (DCIM) system, a building management system (BMS), and a data center management system.

11. The rack liquid cooling manifold system of claim 1, further comprising:

a flow rate sensor communicatively coupled to the at least one manifold control unit and positioned at the intake port of the supply manifold to detect a flow rate of liquid flow received by the supply manifold;

a supply temperature sensor positioned at the intake port of the supply manifold to detect a temperature of the liquid flow received by the supply manifold; and a return temperature sensor positioned at the return port of the return manifold to detect a return temperature of the liquid flow returning from the rack information processing systems;

wherein the at least one manifold control unit monitors and utilizes the flow rate sensor, the supply temperature sensor, and the return temperature sensor to compute adjustments in an open or closed positioning of the supply control valve to modify the input liquid flow rate to meet thermal demands of the rack information processing systems.

12. The rack liquid cooling manifold system of claim 1, wherein interior surfaces of liquid channels within the supply manifold and the return manifold are coated with one or more of a non-conductive, an anti-corrosive, and a hydrophobic surface to substantially eliminate contamination, particulate buildup, and corrosion of the liquid channels from direct exposure to the facility liquid supply.

13. The rack liquid cooling manifold system of claim 1, wherein the at least one manifold control unit comprises:

a primary manifold control unit designated to perform functionality to: (i) receive node-level liquid telemetry data; (ii) trigger the amount of actuation of the supply control valve; and (iii) communicate the rack level information with the datacenter control system; and a secondary manifold control unit that is communicatively coupled to the primary manifold control unit and which, in response to determining that a status signal is not received from the primary manifold control unit indicative that the designated functionality is being performed by the primary manifold control unit, performs the designated functionality.

14. An information processing system rack comprising:

a rack frame divided into a plurality of rungs, each rung capable of supporting an information processing system node having an information processing system with one or more heat-generating electronic components;

at least one cold plate assembly attached to the one or more heat-generating electronic components within the information processing system (IPS) at each corresponding IPS node to thermally cool the one or more heat-generating electronic components via a cooling liquid flow; and a rack liquid cooling manifold system comprising:

a supply manifold comprising a supply control valve and a manifold intake port available for sealably coupling to a facility liquid supply to receive a cooling liquid and comprising more than one server supply ports each available for sealably coupling, for liquid transfer of the cooling liquid, to a respective cooling liquid supply input of a corresponding information processing system node;

a return manifold comprising a facility liquid return port for sealably coupling to a facility return to exhaust the cooling liquid and comprising more than one server return ports, each available for sealably coupling, for exhaust liquid transfer, to a respective cooling liquid exhaust output of the corresponding information processing system node, the respective cooling liquid exhaust output and a paired supply liquid cooling input directing cooling liquid flow through one or more cold plate assembly positioned within the corresponding information processing system node to thermally cool the one or more heat-generating electronic components; and at least one manifold control unit integrated into one of the supply manifold and the return manifold and comprising:

at least one communication interface module configured to communicatively couple the at least one manifold control unit to the supply control valve, and a datacenter control system;

a memory having stored thereon rack temperature and liquid control (RTLC) code; and at least one processor communicatively coupled to the at least one communication interface module and the memory, and which processes instructions of the RTLC code to cause the at least one manifold control unit, while the supply and return manifolds are connected to a rack of information processing systems in a data center, to:

receive node-level liquid telemetry data originating from one or more liquid telemetry sensors integrated at a respective node;

trigger an amount of actuation of the supply control valve to control a rate of cooling liquid flow into the supply manifold, in part based on the node-level liquid telemetry data; and communicate rack level information with the datacenter control system.

15. The information processing system rack of claim 14, wherein the at least one manifold control unit:

receives, from a facility liquid control, at least one facility liquid telemetry from a group comprising supply pressure, return pressure, supply temperature, return temperature, and a flow rate; and actuates the supply control valve in response at least in part to the at least one facility liquid telemetry received.

16. The information processing system rack of claim 14, wherein the at least one manifold control unit:

receives facility liquid telemetry comprising ambient air temperature, supply temperature, and relative humidity;

determines a dew point based on the facility liquid telemetry; and mitigates condensation on portions of the rack liquid cooling manifold system by one of: (i) actuating the supply control valve to maintain a surface temperature of the portions to be above the dew point; and (ii) communicating the dew point to the datacenter control system to prompt an increase in the supply temperature.

17. The information processing system rack of claim 14, wherein the at least one communication interface module further comprises: a plurality of connectors integrated along a length of at least one of the supply manifold and the return manifold to allow for connection to and data communication from each information processing system located within the rack with the at least one manifold control unit.

18. The information processing system rack of claim 14, wherein:

each server microcontroller is communicatively coupled to one of a plurality of integrated connectors and monitors one or more liquid telemetry sensors within the corresponding information processing system node to receive the node-level liquid telemetry data; and the at least one manifold control unit receives node-level liquid telemetry comprising the node-level liquid telemetry data from a corresponding server microcontroller.

19. The information processing system rack of claim 18, wherein the at least one manifold control unit receives from each server microcontroller a corresponding server identifier and the one or more liquid telemetry for a particular information processing system node from among a leak status, a liquid flow rate, an inlet and an outlet temperature of the liquid flow through a cold plate assembly attached to one or more heat-generating electronic component of the node, and a temperature of the one or more heat-generating electronic component.

20. The information processing system rack of claim 14, wherein:

the at least one communication interface module is further configured to communicatively couple the at least one manifold control unit to each of a plurality of node-level liquid control valves; and the at least one processor processes the instructions of the RTLC code to cause the at least one manifold control unit, while the supply and return manifolds are connected to the rack of information processing systems, to trigger an amount of actuation of one or more of the plurality of node-level liquid control valves to control the rate of cooling liquid flow into each of the information processing system nodes, in part based on the node-level liquid telemetry data.

21. The information processing system rack of claim 14, wherein the RTLC code configured the at least one manifold control unit to:

generate server-level telemetry based on data received from the more than one liquid telemetry sensors via a server microcontroller; and communicate the server-level telemetry to a datacenter control system to affect workload assignments to the respective information processing system nodes supported by the rack.

22. The information processing system rack of claim 21, wherein:

the supply manifold comprises a leak containment enclosure and at least one supply leak sensor;

the return manifold comprises a leak containment enclosure and at least one return leak sensor; and the at least one manifold control unit is communicatively coupled to the at least one supply leak sensor and the at least one return leak sensor, and the RTLC code configures the at least one manifold control unit to:

communicate updated liquid manifold telemetry and a leak status to the data control system in response to detecting the leak; and actuate the supply control valve to a closed position in response to detecting a leak based on the at least one supply leak sensor and the at least one return leak sensor.

23. The information processing system rack of claim 14, wherein the RTLC code configures the at least one manifold control unit to communicatively connect to a plurality of different datacenter control systems from among a group of a data center infrastructure management (DCIM) system, a building management system (BMS), and a data center management system.

24. The information processing system rack of claim 14, wherein each cold plate assembly comprises:

a cold plate comprising a thermally conductive material, having a first surface attachable to a heat-generating electronic component of an information processing system, and having a second surface opposed to the first surface and configured with an array of extended fins having exterior surfaces that are coated with at least one of a non-conductive and an anti-corrosive surface treatment, the extended fins supporting use of facility liquid and providing heat transfer directly to the facility liquid without a secondary coolant loop and without corrosion or clogging due to facility liquid particulates; and an encapsulating lid attachable to the second surface encompassing at least the array of extended fins to form a liquid cooling cavity and comprising an intake port sealably coupled for liquid transfer to a corresponding server supply input and an exhaust port sealably coupled to a corresponding server return output for liquid transfer.

25. The information processing system rack of claim 24, wherein the array of extended fins are non-conductive, anti-corrosive (NCAC) extended fins having exterior surfaces that are coated with a surface treatment that makes the extended fins both non-conductive and anti-corrosive.

26. The information processing system rack of claim 24, wherein the array of extending fins are further coated by a hydrophobic layer to prevent scaling and sedimentation due to dissolved calcium carbonate in the facility liquid supply.

27. The information processing system rack of claim 14, wherein each cold plate assembly comprises:

a cold plate comprised of a thermally conductive material, the cold plate having a first surface attachable to a heat-generating electronic component of an information processing system and having a second surface opposite to the first surface and comprising an array of more than one riser columns extending orthogonally from the second surface of the cold plate;

a stacked arrangement of two or more levels of fins that are physically attached to at least one of the more than one riser columns perpendicular to the at least one of the more than one riser columns, the two or more levels spaced apart, substantially in parallel with each other and with the second surface to form a fin stack; and an encapsulating lid attachable to the second surface to form a liquid cooling cavity that encloses the fin stack and comprising an intake port and an exhaust port that are laterally positioned and aligned with the fin stack to create liquid flow through the fin stack for liquid cooling.

28. The information processing system rack of claim 14, wherein the rack liquid cooling manifold system further comprises:

a flow rate sensor communicatively coupled to the at least one manifold control unit and positioned at the intake port of the supply manifold to detect a flow rate of liquid flow received by the supply manifold;

a supply temperature sensor positioned at the intake port of the supply manifold to detect a temperature of the liquid flow received by the supply manifold; and a return temperature sensor positioned at the return port of the return manifold to detect a return temperature of the liquid flow returning from the rack information processing systems;

wherein the at least one manifold control unit monitors and utilized the flow rate sensor, the supply temperature sensor, and the return temperature sensor to compute adjustments in an open or closed positioning of the supply control valve to modify the input liquid flow rate to meet thermal demands of the rack information processing systems.

29. The information processing system rack of claim 14, wherein the at least one manifold control unit communicatively couples to one or more air movers that can be positioned to move air through the more than one information processing system nodes to air cool components within the information processing system nodes, wherein the at least one manifold control unit varies an amounted of air moved through at least one information processing system node in response to the liquid telemetry data and other liquid telemetry received for the corresponding information processing system node.

30. The information processing system rack of claim 14, further comprising one or more return control valves that operate to vary an amounted of exhaust liquid flow that passes through one or more liquid-to-air heat exchangers positioned in a rear door of the rack frame that receives exhaust air from the one or more information processing system nodes, the one or more return control valves communicatively coupled to the at least one manifold control unit, and wherein the at least one manifold control unit actuates the one or more return control valves to vary an amounted of exhaust liquid flow directed through the respective one or more liquid-to-air heat exchangers.

31. The information processing system rack of claim 14, further comprising a plurality of conduits that sealably couple for liquid transfer respectively: (i) the more than one server supply ports of the supply manifold to corresponding server supply inputs of the more than one information processing system nodes; (ii) a corresponding server supply input to intake ports of the one or more cold plate assemblies in the corresponding information processing system node; (iii) exhaust ports of the one or more cold plate assemblies in the corresponding information processing system node to a corresponding server return output; and (iv) and the more than one server return outputs to the server return ports of the return manifold, wherein interior surfaces of the plurality of conduits are coated with one or more of a non-conductive, an anti-corrosive, and a hydrophobic surface to support use of facility liquid as the cooling liquid.

32. The information processing system rack of claim 14, wherein interior surfaces of liquid channels within the supply manifold and the return manifold are coated with one or more of a non-conductive, an anti-corrosive, and a hydrophobic surface to substantially eliminate contamination, particulate buildup, and corrosion of the liquid channels from direct exposure to the facility liquid supply.

33. A datacenter comprising the information processing system rack of claim 14 and further comprising:

the data center control system communicatively coupled to the at least one manifold control unit;

the facility liquid supply; and an open-loop liquid distribution system of conduits sealably connected between the intake port of the supply manifold and the facility liquid supply to receive unheated facility liquid and between the exhaust port of return manifold and a facility liquid supply return to exhaust heated liquid from the IPS rack to the facility liquid supply return.

34. The information processing system rack of claim 14, wherein the at least one manifold control unit comprises:

a primary manifold control unit designated to perform functionality to: (i) receive node-level liquid telemetry data; (ii) trigger the amount of actuation of the supply control valve; and (iii) communicate the rack level information with the datacenter control system; and a secondary manifold control unit that is communicatively coupled to the primary manifold control unit and which, in response to determining that a status signal is not received from the primary manifold control unit indicative that the designated functionality is being performed, performs the designated functionality.

* * * * *